(12) United States Patent
Kim et al.

(10) Patent No.: US 12,469,462 B2
(45) Date of Patent: Nov. 11, 2025

(54) GATE DRIVING CIRCUIT

(71) Applicant: SAMSUNG DISPLAY CO., LTD., Yongin-si (KR)

(72) Inventors: Kyungho Kim, Yongin-si (KR); Sangyong No, Yongin-si (KR); Gichang Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/436,904

(22) Filed: Feb. 8, 2024

(65) Prior Publication Data
US 2024/0321215 A1   Sep. 26, 2024

(30) Foreign Application Priority Data

Mar. 24, 2023 (KR) .................. 10-2023-0039089
Aug. 8, 2023 (KR) .................. 10-2023-0103701

(51) Int. Cl.
*G09G 3/3266* (2016.01)
*G09G 3/3233* (2016.01)
*H03K 17/687* (2006.01)

(52) U.S. Cl.
CPC ......... *G09G 3/3266* (2013.01); *G09G 3/3233* (2013.01); *H03K 17/6871* (2013.01); *G09G 2300/0842* (2013.01); *G09G 2310/0286* (2013.01); *G09G 2310/061* (2013.01); *G09G 2310/08* (2013.01)

(58) Field of Classification Search
CPC ............... G09G 3/3266; G09G 3/3233; G09G 2300/0842; G09G 2310/0286; G09G 2310/061; G09G 2310/08; H03K 17/6871
See application file for complete search history.

(56) References Cited

U.S. PATENT DOCUMENTS

| | | | |
|---|---|---|---|
| 7,696,974 B2 | 4/2010 | Moon et al. | |
| 9,786,243 B2 | 10/2017 | Cho et al. | |
| 9,940,889 B2 | 4/2018 | Park et al. | |
| 11,189,677 B2 | 11/2021 | Park et al. | |
| 2017/0032733 A1* | 2/2017 | Jang | ............ G09G 3/20 |
| 2020/0394978 A1* | 12/2020 | Lim | ......... G09G 3/3696 |

FOREIGN PATENT DOCUMENTS

| | | |
|---|---|---|
| KR | 10-2016-0089028 A | 7/2016 |
| KR | 10-2016-0148131 A | 12/2016 |
| KR | 10-2020-0019308 A | 2/2020 |
| KR | 10-2022-0095652 A | 7/2022 |

* cited by examiner

*Primary Examiner* — Afroza Chowdhury
(74) *Attorney, Agent, or Firm* — F. CHAU & ASSOCIATES, LLC

(57) ABSTRACT

A stage of a gate driving circuit includes a first control circuit connected to a first voltage input terminal receiving a first voltage and a second voltage input terminal receiving a second voltage lower than the first voltage, the first control circuit being configured to control voltage levels of a first control node and a second control node; a first output circuit connected to a first clock terminal and a third voltage input terminal receiving a third voltage, the first output circuit being configured to output a gate signal according to the voltage levels of the first control node and the second control node; and a second output circuit connected to a second clock terminal and the second voltage input terminal, the second output circuit being configured to output a carry signal according to the voltage levels of the first control node and the second control node.

20 Claims, 14 Drawing Sheets

GATE DRIVING CIRCUIT

CROSS-REFERENCE TO RELATED APPLICATIONS

This U.S. patent application claims priority under 35 U.S.C. § 119 to Korean Patent Applications Nos. 10-2023-0039089 and 10-2023-0103701, respectively filed on Mar. 24, 2023 and Aug. 8, 2023, in the Korean Intellectual Property Office, the disclosures of which are incorporated by reference in their entireties herein.

1. TECHNICAL FIELD

Embodiments of the present disclosure are generally directed to a display apparatus, and more particularly, to a gate driving circuit configured to output a gate signal and a display apparatus including the gate driving circuit.

2. DISCUSSION OF RELATED ART

A display apparatus typically includes a display panel including a plurality of pixels for displaying images, a gate driving circuit for driving gate lines of the display panel, a data driving circuit for driving data lines of the display panel, and a controller for controlling the gate and data driving circuits. The gate driving circuit may include stages connected to the gate lines, and the stages may supply gate signals to the gate lines connected to the stages, in response to signals from the controller. However, the gate driving circuit may become defective when transistors of the gate driving circuit deteriorate.

SUMMARY

At least embodiment of the disclosure includes a gate driving circuit configured to stably output a gate signal and a display apparatus including the gate driving circuit.

According to an embodiment, a gate driving circuit includes a plurality of stages. Each of the stages include a first control circuit, a first output circuit, and a second output circuit. The first control circuit is connected to a first voltage input terminal receiving a first voltage and a second voltage input terminal receiving a second voltage lower than the first voltage. The first control circuit is configured to control voltage levels of a first control node and a second control node. The first output circuit is connected to a first clock terminal and a third voltage input terminal receiving a third voltage. The first output circuit is configured to output a gate signal according to the voltage levels of the first control node and the second control node. The second output circuit is connected to a second clock terminal and the second voltage input terminal. The second output circuit is configured to output a carry signal according to the voltage levels of the first control node and the second control node. The first control circuit includes a first transistor and a second transistor. The first transistor is connected to a first input terminal and the first control node. The first transistor has a gate connected to the first input terminal. The second transistor is connected to the first input terminal and the first control node. The second transistor has a gate connected to a second input terminal. The second transistor includes a first sub-transistor and a second sub-transistor that are connected in series. The first input terminal is connected to an output terminal of the second output circuit of a previous stage. The second input terminal is connected to the output terminal of the second output circuit of a next stage. The second voltage is lower than the third voltage.

The first transistor may include a first sub-transistor and a second sub-transistor that are connected in series, and the first control circuit may further include a third transistor connected to the first control node and the second voltage input terminal, the third transistor having a gate connected to the second control node and a fourth transistor connected between the first voltage input terminal and an intermediate node between the first sub-transistor and the second sub-transistor of the first transistor, the fourth transistor having a gate connected to the first control node.

The first control circuit may further include a fifth transistor connected to the second control node and the second voltage input terminal, the fifth transistor having a gate connected to the first control node and a sixth transistor connected to the first voltage input terminal and the second control node, the sixth transistor having a gate connected to the second input terminal.

The fifth transistor may include a first sub-transistor and a second sub-transistor that are connected in series, and the first control circuit may further include a seventh transistor connected between the first voltage input terminal and an intermediate node between the first sub-transistor and the second sub-transistor of the fifth transistor, the seventh transistor having a gate connected to the second control node.

Each of the plurality of stages may further include an eighth transistor connected to the first control node and the second voltage input terminal, the eighth transistor having a gate connected to a terminal to which a first control signal is input, and a ninth transistor connected to the first voltage input terminal and the second control node, the ninth transistor having a gate connected to the terminal to which the first control signal is input.

The first output circuit may include a plurality of sub-output circuits configured to output a plurality of gate signals, the first clock terminal of each of the plurality of sub-output circuits may receive a corresponding one of a plurality of first clock signals, and the plurality of first clock signals may have a same waveform and have phases shifted by a predetermined interval.

Each of the plurality of stages may further include a boosting circuit connected to a third clock terminal and the second voltage input terminal, the boosting circuit being configured to boost the voltage level of the first control node, and a period during which a third clock signal that is input to the third clock terminal is a gate-on voltage may overlap periods during which the plurality of first clock signals are the gate-on voltage.

The boosting circuit may include a tenth transistor connected to the third clock terminal and a first node, the tenth transistor having a gate connected to the first control node, an eleventh transistor connected to the first node and the second voltage input terminal, the eleventh transistor having a gate connected to the second control node, and a first capacitor connected to the first control node and the first node.

The second output circuit may include a twelfth transistor connected to the second clock terminal and the output terminal configured to output the carry signal, the twelfth transistor having a gate connected to the first control node, and a thirteenth transistor connected to the output terminal and the second voltage input terminal, the thirteenth transistor having a gate connected to the second control node.

Each of the plurality of stages may further include a second control circuit connected to the first voltage input terminal and the first control node, the second control circuit being configured to control the voltage level of the first control node during a sensing period of a frame including a display period and the sensing period.

The second control circuit may include a second capacitor connected to the first voltage input terminal and a sensing node, a fourteenth transistor connected to the sensing node and the output terminal configured to output the carry signal, the fourteenth transistor including a first sub-transistor and a second sub-transistor that are connected in series, a fifteenth transistor connected to the first voltage input terminal and an intermediate node between the first sub-transistor and the second sub-transistor of the fourteenth transistor, the fifteenth transistor having a gate connected to the sensing node, and a sixteenth transistor connected to the fifteenth transistor and the first control node.

The fourteenth transistor may be configured to be turned on by a second control signal synchronized to the carry signal output during the display period and to set a voltage of the sensing node as a voltage of the carry signal.

The sixteenth transistor may be configured to be turned on by a third control signal that is input during the sensing period and to set a voltage of the first control node to the first voltage transmitted through the fifteenth transistor that is turned on.

According to an embodiment, a gate driving circuit includes a plurality of stages. Each stage includes a first output circuit, a second output circuit, a boosting circuit, and a control circuit. The first output circuit includes a first pull-up transistor having a gate connected to a first control node and a first pull-down transistor having a gate connected to a second control node. The first output circuit is configured to output a gate signal. The second output circuit includes a second pull-up transistor having a gate connected to the first control node and a second pull-down transistor having a gate connected to the second control node. The second output circuit is configured to output a carry signal. The boosting circuit is configured to boost a voltage level of the first control node. The control circuit is configured to control the voltage level of the first control node and a voltage level of the second control node. The control circuit includes a first transistor including a first sub-transistor and a second sub-transistor that are connected in series. The first transistor is configured to pull-down, to a second voltage level, a voltage of the first control node boosted by the boosting circuit to a first voltage level. For example, the first transistor may pulldown the second voltage level of the first control node to the first voltage level.

The control circuit may further include a second transistor connected to a first input terminal to which a carry signal of a previous stage is input and the first control node, the second transistor having a gate connected to the first input terminal, a third transistor connected to a first voltage input terminal to which the first voltage is input and the second control node, the third transistor having a gate connected to a second input terminal to which a carry signal of a next stage is input, a fourth transistor connected to the second control node and a second voltage input terminal to which the second voltage that is lower than the first voltage is input, the fourth transistor having a gate connected to the first control node, and a fifth transistor connected to the first control node and the second voltage input terminal, the fifth transistor having a gate connected to the second control node, wherein the first transistor may be connected to the first input terminal and the first control node and has a gate connected to the second input terminal.

The second transistor and the fourth transistor each may include a first sub-transistor and a second sub-transistor that are connected in series, and the first control circuit may further include a sixth transistor connected between the first voltage input terminal and an intermediate node between the first sub-transistor and the second sub-transistor of the second transistor, the sixth transistor having a gate connected to the first control node, and a seventh transistor connected between the first voltage input terminal and an intermediate node between the first sub-transistor and the second sub-transistor of the fourth transistor, the seventh transistor having a gate connected to the second control node.

The first output circuit may include a plurality of sub-output circuits configured to output a plurality of gate signals, the first pull-up transistor of each of the plurality of sub-output circuits may be connected to a scan clock terminal to which one of a plurality of scan clock signals is input and an output terminal configured to output the gate signals, and the plurality of scan clock signals may have a same waveform and have phases shifted by a predetermined interval.

The boosting circuit may include a capacitor configured to boost the voltage of the first control node in response to a boosting clock signal, and a period during which the boosting clock signal is a gate-on voltage may overlap periods during which the plurality of scan clock signals are the gate-on voltage.

Each of the plurality of stages may further include a second control circuit configured to control the voltage level of the first control node during a sensing period of one frame.

The second control circuit may include a capacitor connected to the first voltage input terminal and a sensing node, an eighth transistor connected to the sensing node and an output terminal of the second output circuit, the eighth transistor including a first sub-transistor and a second sub-transistor that are connected in series, a ninth transistor connected to the first voltage input terminal and an intermediate node between the first sub-transistor and the second sub-transistor of the eighth transistor, the ninth transistor having a gate connected to the sensing node, and a tenth transistor connected to the ninth transistor and the first control node.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
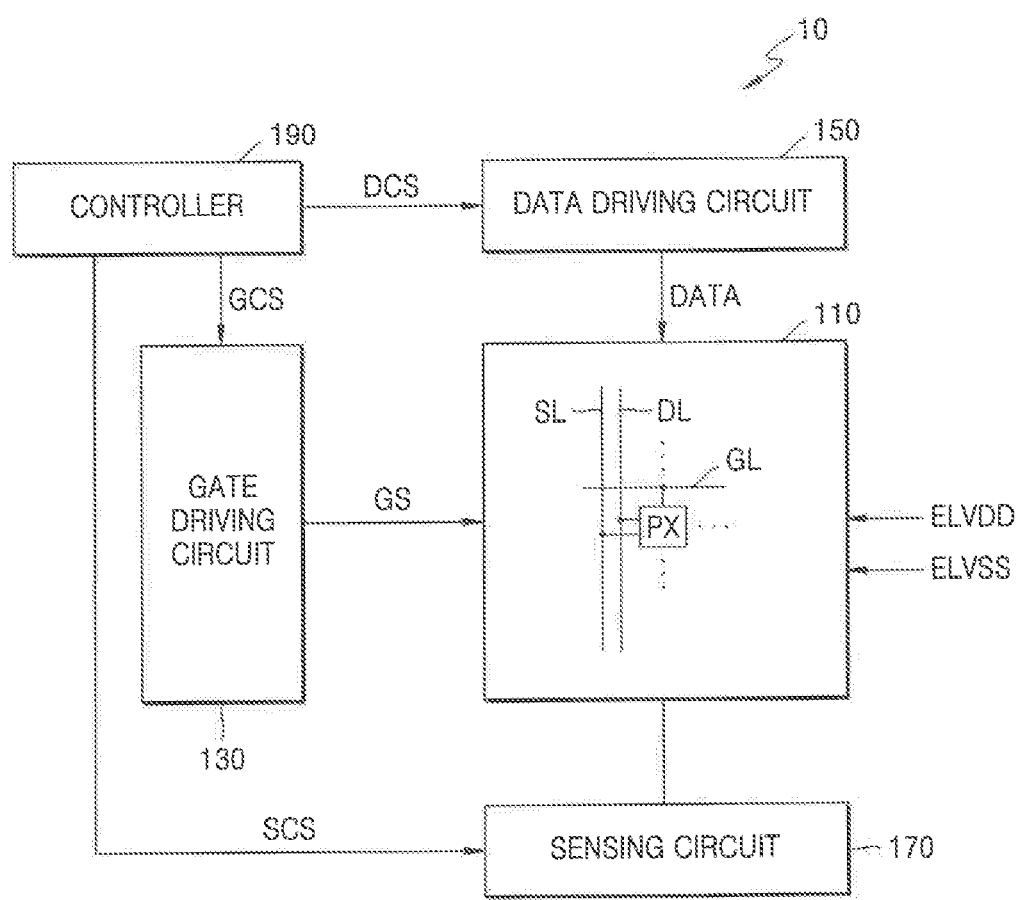
FIG. 1 is a diagram schematically showing a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure and methods of achieving the same will become apparent by referring to the embodiments described in detail below along with the drawings. However, the disclosure is not limited to the embodiments disclosed hereinafter and may be realized in various forms.

As used herein, the singular expressions "a," "an," and "the" are intended to include the plural forms as well, unless the context clearly indicates otherwise.

It will be understood that when a layer, region, or element is referred to as being formed "on" another layer, area, or element, it can be directly or indirectly formed on the other layer, region, or element. That is, for example, intervening layers, regions, or elements may be present.

In this specification, the expression "A and/or B" may indicate A, B, or A and B. Also, in this specification, the expression "at least one of A and B" may indicate A, B, or A and B.

In an embodiment described hereinafter, when X and Y are referred to as being connected to each other, it may indicate cases where X and Y are electrically connected to each other, X and Y are functionally connected to each other, or X and Y are physically connected to each other. And when X and Y are referred to as being connected to each other, it may indicate cases where X and Y are directly connected to each other, or X and Y are indirectly connected to each other. Here, X and Y may be objects (e.g., devices, elements, circuits, lines, electrodes, terminals, conductive layers, layers, etc.). Thus, X and Y are not limited to a predetermined connection relationship, for example, a connection relationship indicated in the drawings or the detailed description. Rather, X and Y may include other connection relationships in addition to the connection relationship indicated in the drawings or the detailed description.

The case where X and Y are electrically connected to each other may include, for example, a case where X and Y are electrically and directly connected to each other, or a case where at least one device (e.g., a switch, a transistor, a capacitance device, an inductor, a resistance device, a diode, etc.) for allowing electrical connection between X and Y is connected between X and Y.

In an embodiment described hereinafter, the terms "on" and "off" used in relation to a device state refer to an activated state of the device and a non-activated state of the device, respectively. The terms "on" and "off" used in relation to a signal received by a device may refer to signals configured to activate the device and non-activate the device, respectively. The device may be activated by a high-level voltage or a low-level voltage. For example, a P-channel transistor (a P-type transistor) may be activated by a low-level voltage, and an N-channel transistor (an N-type transistor) may be activated by a high-level voltage. Thus, it shall be understood that "on" voltages with respect to the P-type transistor and the N-type transistor may be opposite voltages (low versus high) to each other.

In an embodiment described hereinafter, an x direction, a y direction, and a z direction are not limited to directions in three axes on a rectangular coordinate system and may be interpreted in a broader sense. For example, the x direction, the y direction, and the z direction may be perpendicular to one another or may refer to different directions that are not perpendicular to one another.

A display apparatus according to some embodiments may display a moving image or a static image and may be used as a display screen not only of portable electronic devices, such as a mobile phone, a smartphone, a tablet personal computer (PC), a mobile communication terminal, an electronic notebook, an electronic book, a portable multimedia player (PMP), a navigation device, and a ultra mobile PC (UMPC), but also of various products, such as a television (TV), a notebook computer, a monitor, a signboard, an Internet of things, etc. Also, the display apparatus according to an embodiment may be used in wearable devices, such as a smart watch, a watch phone, a glasses-type display, and a head-mounted display (HMD). Also, the display apparatus according to an embodiment may be used as: a center information display (CID) on a gauge of a vehicle or a center fascia or a dashboard of the vehicle; a room mirror display substituting a side-view mirror of a vehicle; or a display disposed on a rear surface of a front seat, as an entertainment device for a backseat of a vehicle. Also, the display apparatus may be a flexible apparatus.

FIG. 1 is a diagram schematically showing the display apparatus 10 according to an embodiment.

Referring to FIG. 1, the display apparatus 10 may include a pixel portion 110 (e.g., a display panel), a gate driving circuit 130, a data driving circuit 150, a sensing circuit 170, and a controller 190 (e.g., a controller circuit).

The pixel portion 110 may be provided in a display area. In a peripheral area outside the display area, various conductive lines configured to transmit an electrical signal to be applied to the display area, external circuits electrically connected to pixel circuits, and pads to which a printed circuit board (PCB) or a driver integrated circuit (IC) chip is coupled may be arranged. For example, in the peripheral area, the gate driving circuit 130, the data driving circuit 150, the sensing circuit 170, and the controller 190 may be disposed.

A plurality of gate lines GL, a plurality of data lines DL, a plurality of sensing lines SL, and a plurality of pixels PX connected thereto may be arranged in the pixel portion 110.

The plurality of pixels PX may be arranged in various arrangement forms, for example, a stripe form, a pentile form (a diamond form), a mosaic form, etc., to realize an image. Each of the plurality of pixels PX may include an organic light-emitting diode as a display element (a light-emitting device), and the organic light-emitting diode may be connected to a pixel circuit. The pixel circuit may include a plurality of transistors and at least one capacitor. The pixel PX may emit for example, red, green, blue, or white light through the organic light-emitting diode. Each pixel PX may be connected to a corresponding gate line from among the plurality of gate lines GL, a corresponding sensing line from among the plurality of sensing lines SL and a corresponding data line from among the plurality of data lines DL.

The plurality of pixels PX may be arranged in at least one corner of the display apparatus 10 to overlap the gate driving circuit 130. Thus, a dead space may be reduced, and the display area may be expanded.

Each of the gate lines GL may extend in an x direction (a row direction) and may be connected to the pixels PX arranged in the same row. Each of the gate lines GL may be configured to transmit a gate signal to the pixels PX arranged in the same row. Each of the data lines DL may extend in a y direction (a column direction) and may be connected to the pixels PX arranged in the same column. Each of the data lines DL may be synchronized to the gate signal and may be configured to transmit the data signal DATA to each of the pixels PX in the same column. Each of the sensing lines SL may extend in the y direction (the column direction) and may be connected to the pixels PX arranged in the same column.

The gate driving circuit 130 may be connected to the plurality of gate lines GL and configured to generate gate signals in response to a control signal GCS from the controller 190 and sequentially supply the gate signals to the gate lines GL. The gate line GL may be connected to a gate of a transistor included in the pixel PX. The gate signal GS may be a gate control signal configured to control turning on and turning off of the transistor having the gate connected to the gate line GL. The gate signal may be a square wave signal including a gate-on voltage for turning on the transistor and a gate-off voltage for turning off the transistor.

The data driving circuit 150 may be connected to the plurality of data lines DL and configured to supply data signals DATA to the data lines DL in response to a control signal DCS from the controller 190. The data signal DATA supplied to the data line DL may be supplied to the pixel PX to which the gate signal is supplied. The data driving circuit 150 may convert input image data having a gradation, which is input from the controller 190, into the data signal DATA in the form of a voltage or a current.

The sensing circuit 170 may be connected to the plurality of sensing lines SL and configured to sense, during a sensing period, state information of the pixels PX through the sensing lines SL in response to a control signal SCS from the controller 190. According to an embodiment, the sensing line SL may be disposed for each vertical line (column). According to another embodiment, a single sensing line SL may be shared by the pixels PX of a plurality of columns. The sensing circuit 170 may be configured to measure the state information of the pixels PX based on a current and/or a voltage fed back through the sensing lines SL. The state information may include at least one of a threshold voltage and a mobility of a driving transistor included in the pixel PX, and deterioration information of a display element of the pixel PX such as an organic light-emitting diode. The state information of the pixel PX may be transmitted to the controller 190 and/or the data driving circuit 150 and may be used to correct the data signal DATA.

The controller 190 may be configured to generate the control signals GCS, DCS, and SCS based on signals that are input from the outside and supply the control signals GCS, DCS, and SCS to the gate driving circuit 130, the data driving circuit 150, and the sensing circuit 170. The control signal GCS that is output to the gate driving circuit 130 may include a plurality of clock signals and a start signal. The control signal DCS that is output to the data driving circuit 150 may include a start signal and a plurality of clock signals.

The display apparatus 10 may supply a driving voltage ELVDD and a common voltage ELVSS to the pixels PX. The driving voltage ELVDD may be a high-level voltage provided to a driving transistor electrically connected to a first electrode (a pixel electrode or an anode) of the display element included in the pixel PX. The common voltage ELVSS may be a low-level voltage provided to a second electrode (an opposite electrode or a cathode) of the display element included in the pixel PX.

The display apparatus 10 may include a display panel, and the display panel may include a substrate. The pixels PX may be arranged in a display area of the substrate. Part or all of the gate driving circuit 130 may be directly formed in a peripheral area of the substrate, during a process of forming the transistor included in the pixel circuit in the display area of the substrate. The data driving circuit 150, the sensing circuit 170, and the controller 190 each may be formed as a separate integrated circuit (IC) chip or may be formed as a single IC chip and may be arranged on a flexible PCB (FPCB) electrically connected to a pad arranged on a side of the substrate. According to another embodiment, the data driving circuit 150, the sensing circuit 170, and the controller 190 may be directly arranged on the substrate using a chip on glass (COG) or chip on plastic (COP) bonding method.

Hereinafter, an organic light-emitting display apparatus is described as an example of a display apparatus according to an embodiment. However, the display apparatus according to the disclosure is not limited thereto. According to another embodiment, the display apparatus according to the disclosure may include a display apparatus, such as an inorganic light-emitting display apparatus, an inorganic electro-luminescence (EL) display apparatus, or a quantum dot light-emitting display apparatus.

Figure 2:
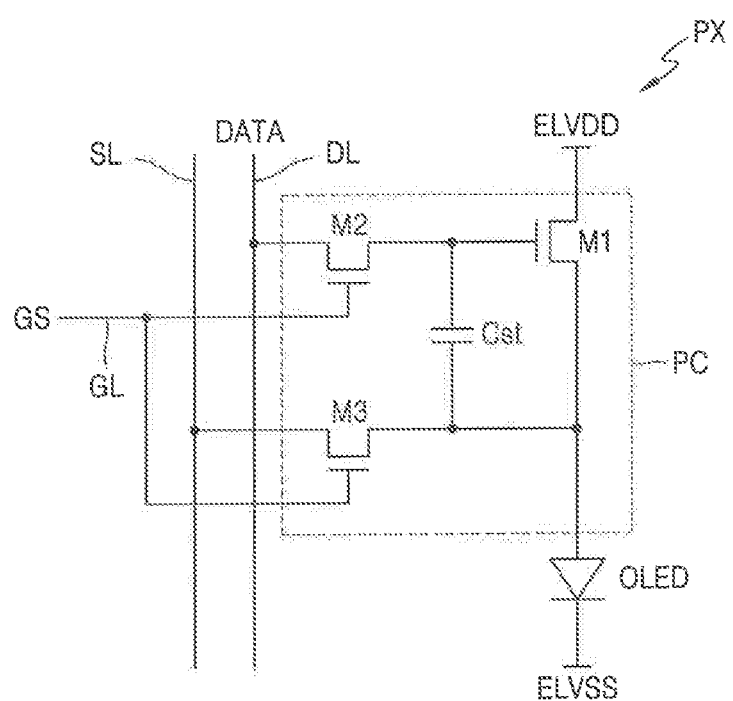
FIG. 2 is an equivalent circuit diagram of a pixel according to an embodiment.

FIG. 2 is an equivalent circuit diagram of a pixel PX according to an embodiment.

Referring to FIG. 2, each pixel PX may include a pixel circuit PC and an organic light-emitting diode OLED as a display element connected to the pixel circuit PC. The pixel circuit PC may include a first transistor M1, a second transistor M2, a third transistor M3, and a capacitor Cst. The first transistor M1 may be a driving transistor configured to output a driving current corresponding to a data signal DATA, and the second transistor M2 and the third transistor M3 may be switching transistors configured to transmit a signal. A first terminal (a first electrode) and a second terminal (a second electrode) of each of the first to third transistors M1 to M3 may be a source or a drain according to voltages of the first and second terminals. For example, according to the voltages of the first terminal and the second terminal, the first terminal may be a drain and the second terminal may be a source or the first terminal may be a source and the second terminal may be a drain.

The first transistor M1 may include a gate connected to a second terminal of a second transistor M2 and a capacitor Cst, a first terminal connected to a first power source configured to supply a driving voltage ELVDD and a second terminal connected to a first electrode (a pixel electrode) of the organic light-emitting diode OLED. The first transistor M1 may be configured to control a driving current flowing from the first power source to the organic light-emitting diode OLED, in response to a voltage stored in the capacitor Cst. The organic light-emitting diode OLED may emit light having a certain brightness according to the driving current.

The second transistor M2 (a write transistor) may include a gate connected to a gate line GL, a first terminal connected to a data line DL, and a second terminal connected to the gate of the first transistor M1. The second transistor M2 may be turned on by a gate signal GS supplied to the gate line GL and may be configured to electrically connect the data line DL with the gate of the first transistor M1 and transmit a data signal DATA that is input through the data line DL to the gate of the first transistor M1.

The third transistor M3 (a sensing transistor) may include a gate connected to the gate line GL, a first terminal connected to the second terminal of the first transistor M1 and the first electrode of the organic light-emitting diode OLED, and a second terminal connected to a sensing line SL. The third transistor M3 may be turned on by a gate signal GS supplied to the gate line GL and may be configured to electrically connect the sensing line SL with the second terminal of first transistor M1 and the first electrode of the organic light-emitting diode OLED and transmit a current and/or a voltage supplied from the second terminal of first transistor M1 to the first electrode of the organic light-emitting diode OLED to the sensing line SL.

The capacitor Cst may be connected between the gate of the first transistor M1 and the second terminal of the first transistor M1. The capacitor Cst may store a voltage corresponding to a difference between a voltage transmitted from the second transistor M2 and a voltage of the second terminal of the first transistor M1.

The organic light-emitting diode OLED may include the first electrode (the pixel electrode) connected to the second terminal of the first transistor M1 and a second electrode (an opposite electrode) connected to a second power source to which a common voltage ELVSS is applied. The organic light-emitting diode OLED may emit light having a brightness corresponding to the amount of driving currents supplied from the first transistor M1.

In FIG. 2, the transistors of the pixel circuit are illustrated as N-type transistors. However, embodiments of the disclosure are not limited thereto. For example, the transistors of the pixel circuit may include P-type transistors, or some of the transistors of the pixel circuit may include P-type transistors and the others may include N-type transistors. As such, various embodiments are possible.

According to an embodiment, at least the first transistor M1 may include an oxide thin-film transistor including a semiconductor layer including an amorphous or crystalline oxide semiconductor. For example, the first to third transistors M1 to M3 may include oxide thin-film transistors. The oxide thin-film transistor may have excellent off-current characteristics. The oxide semiconductor may include a Zn oxide-based material, such as Zn oxide, In—Zn oxide, Ga—In—Zn oxide, etc. According to some embodiments, the oxide semiconductor may include an In—Ga—Zn—O (IGZO) semiconductor. According to some embodiments, the oxide semiconductor may include an In—Sn—Ga—Zn—O (ITGZO) semiconductor. According to an embodiment, the oxide thin-film transistor may include a low temperature polycrystalline oxide (LTPO) thin-film transistor. Alternatively, according to an embodiment, at least one of the first to third transistors M1 to M3 may include a low temperature polysilicon (LTPS) thin-film transistor including a semiconductor layer including polysilicon.

When a gate signal is supplied to the pixel PX through a gate line corresponding to the pixel PX during a driving period, the pixel PX may receive a data signal from a data line corresponding to the pixel PX. The pixel PX receiving the data signal may control, in response to the data signal, the amount of currents flowing from a driving voltage source to a common voltage source through the organic light-emitting diode OLED. Here, the organic light-emitting diode OLED may generate light of a certain brightness according to the amount of currents.

When a gate signal is supplied to the pixel PX through a gate line corresponding to the pixel PX during a sensing period, the pixel PX may output a current and/or a voltage to a sensing line (e.g., SL) based on a sensing signal supplied through a data line corresponding to the pixel PX.

Figure 3:
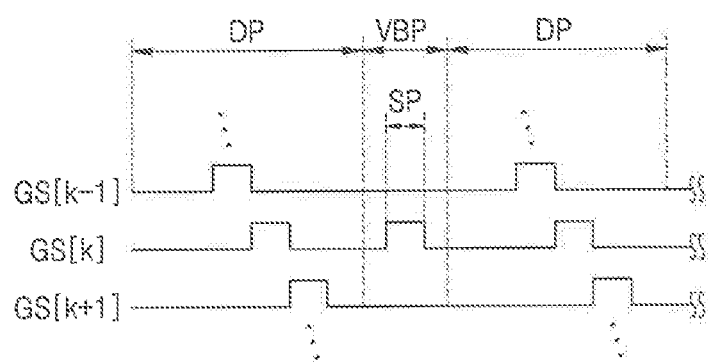
FIG. 3 is a diagram for describing a driving operation of a display apparatus according to an embodiment.

FIG. 3 is a diagram for describing a driving operation of a display apparatus according to an embodiment.

Referring to FIG. 3, during one frame (or frame period), the display apparatus may operate in a display period DP during which an image is displayed and a vertical blank period VBP. Because state information of a pixel may be sensed during the vertical blank period VBP, it may be understood that the vertical blank period VBP may include a sensing period SP.

During the display period DP, the pixels PX may display a predetermined image in response to a data signal. A second transistor M2 and a third transistor M3 of the pixel PX may be turned on in response to a gate signal GS supplied during the display period DP, and thus, a voltage between a gate of the first transistor M1 of the pixel PX and a second terminal of the first transistor M1 may be set according to a driving current. When the gate signal GS is supplied, a data signal DATA may be supplied through a data line DL and an initialization voltage may be supplied through a sensing line SL. According to an embodiment, the initialization voltage is set in response to the deterioration of an organic light-emitting diode OLED. For example, the initialization voltage may be adjusted based how much the organic light-emitting diode OLED has deteriorated. When the initialization voltage is supplied to the pixel PX during the display period DP, a voltage required for a capacitor Cst may be charged without being affected by the deterioration of the organic light-emitting diode OLED.

The sensing period SP may be activated in an arbitrary frame (or frame period) according to a predetermined frame cycle or a user's setting. During the sensing period SP, an arbitrary row for pixel sensing may be selected. FIG. 3 illustrates an example in which the pixels PX in a $k^{th}$ row are sensed during the sensing period SP. The $k^{th}$ row may be located between a $(k+1)^{th}$ row and $(k-1)^{th}$ row. The $k^{th}$ row may receive a $k^{th}$ gate signal GS[k], the $(k+1)^{th}$ row may receive a $(k+1)^{th}$ gate signal GS[k+1], and the $(k-1)^{th}$ row may receive a $(k-1)^{th}$ gate signal GS[k-1].

The second transistor M2 and the third transistor M3 of the pixel PX may be turned on in response to a gate signal GS supplied during the sensing period SP. When the gate signal GS is supplied, a sensing voltage for sensing the pixel may be supplied through the data line DL, and a mobility and/or a threshold voltage of the first transistor M1 may be measured through measurement of a current and/or a voltage of the sensing line SL. According to an embodiment, the sensing voltage includes a black gradation voltage for turning off the first transistor M1. According to an embodiment, the sensing voltage includes a predetermined reference voltage. The reference voltage may be set to a voltage that turns on the first transistor M1. A voltage applied to a first electrode of the organic light-emitting diode OLED may include deterioration information of the organic light-emitting diode OLED. For example, it may be possible to determine how much the organic light-emitting diode OLED has deteriorated by analyzing the voltage applied to its first electrode during the sensing period SP. According to various embodiments, after the sensing period SP, a period for initializing a voltage of a gate of the first transistor M1 and/or the voltage of the first electrode of the organic light-emitting diode OLED or re-setting the same to be a voltage set before the sensing period SP may further be provided.

Figure 4:
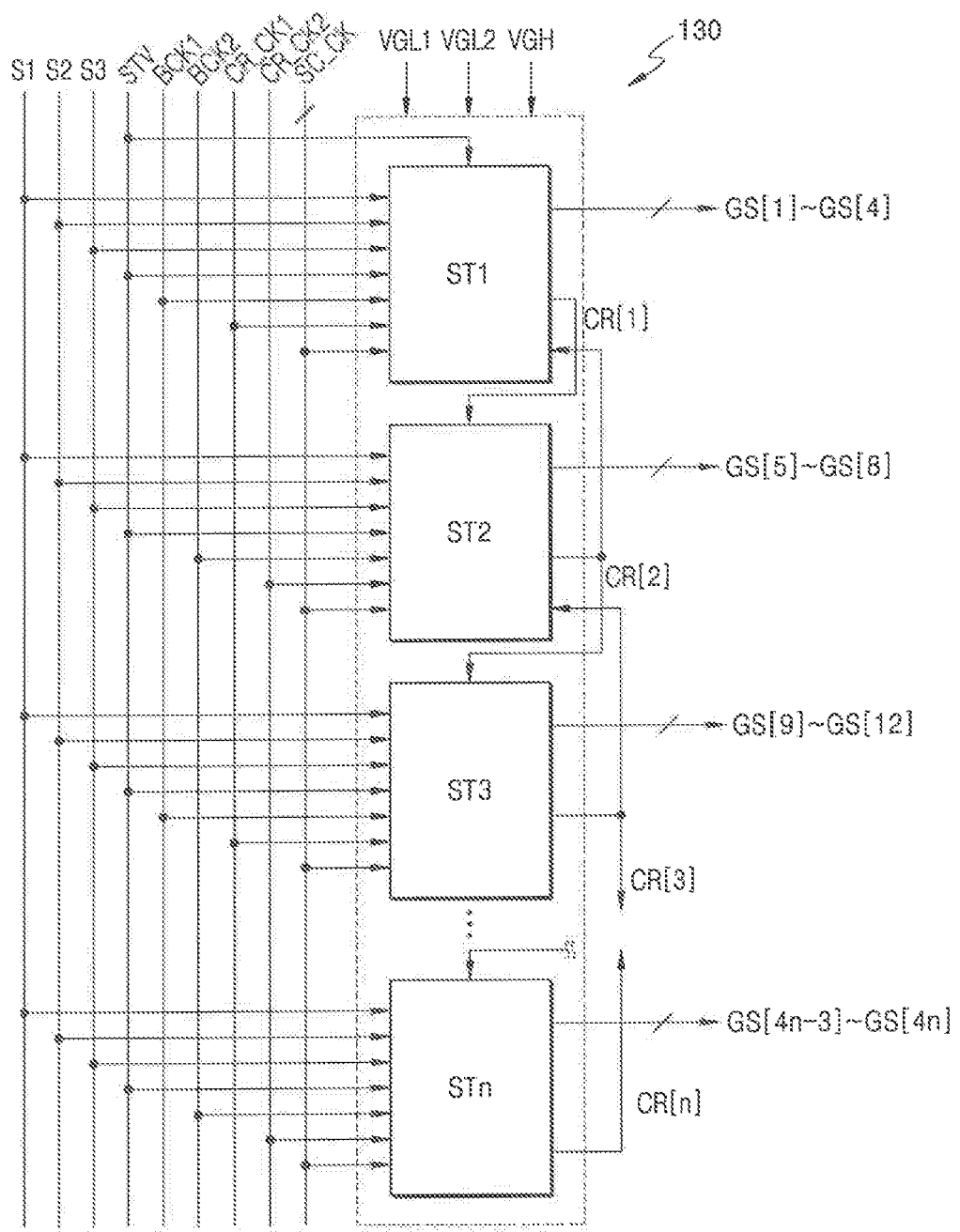
FIG. 4 is a diagram schematically showing a gate driving circuit according to an embodiment.
Figure 5:
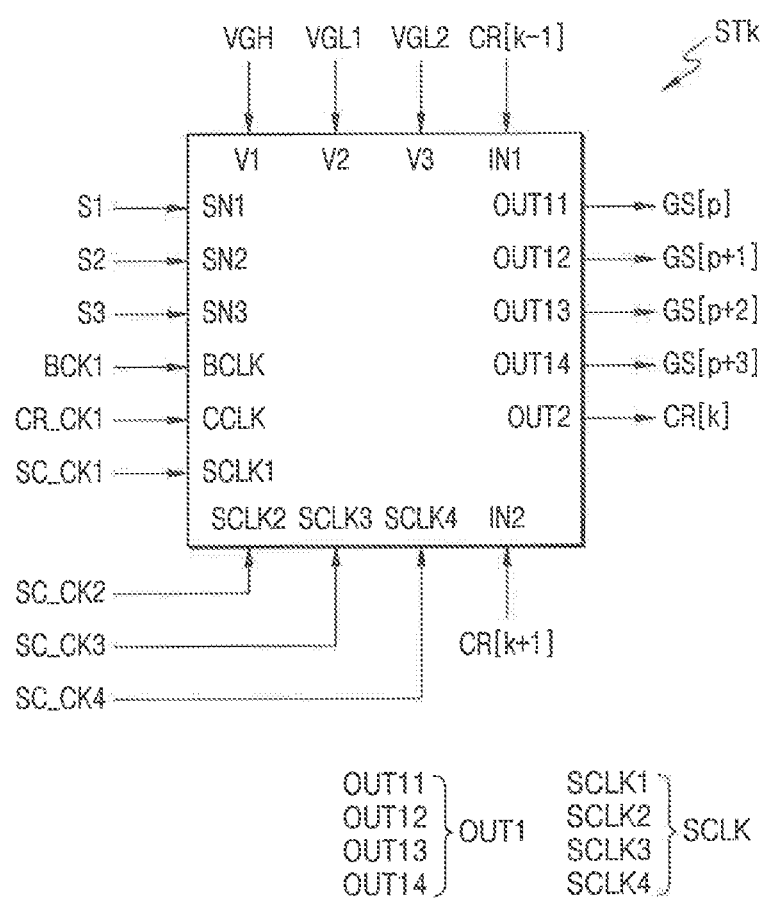
FIG. 5 is a diagram schematically showing a stage of the gate driving circuit illustrated in FIG. 4.
Figure 6:
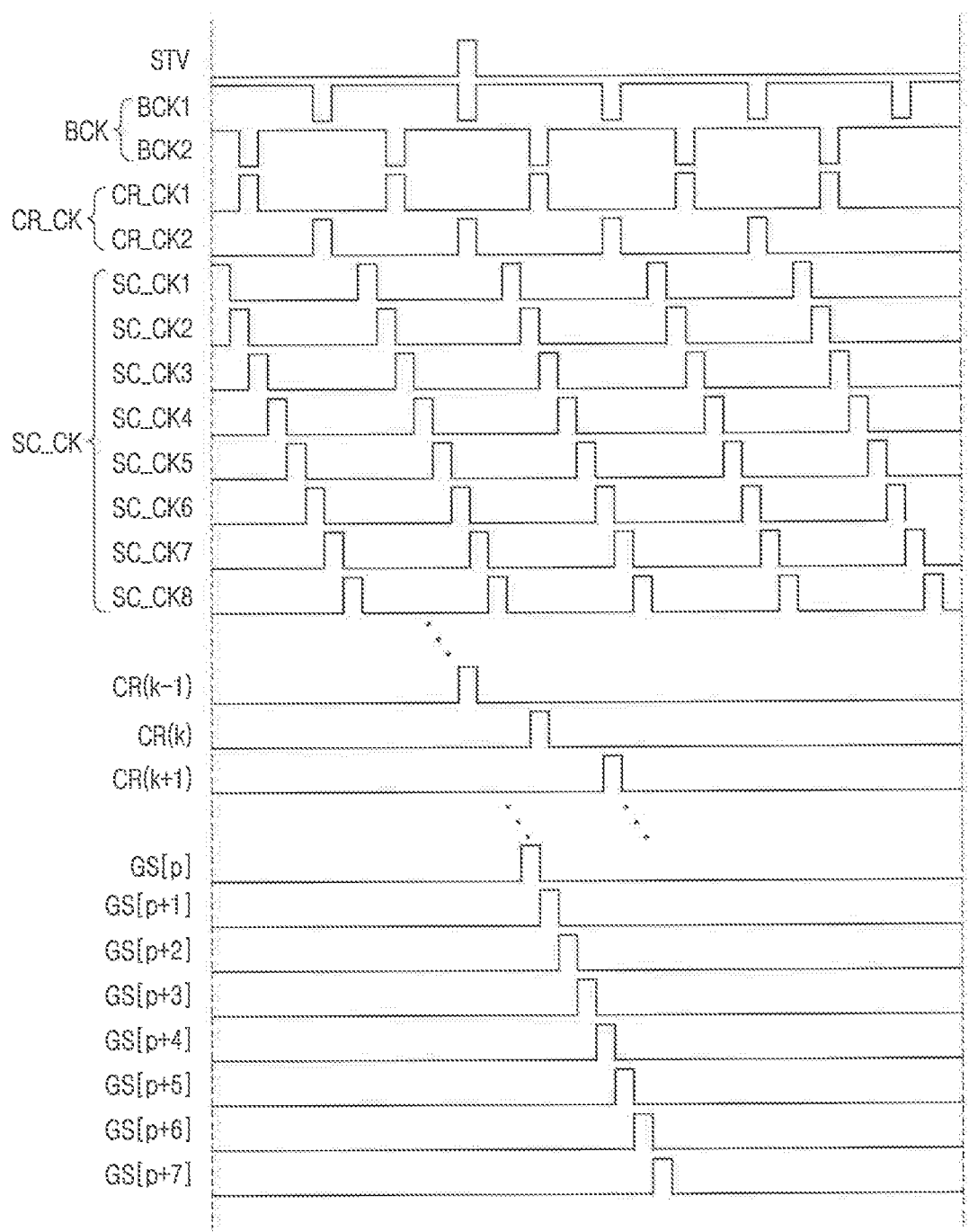
FIG. 6 is a diagram showing signals that are input to stages of the gate driving circuit illustrated in FIG. 4 and signals that are output from the stages.

FIG. 4 is a diagram schematically showing the gate driving circuit 130 according to an embodiment. FIG. 5 is a diagram schematically showing a stage of the gate driving circuit 130 illustrated in FIG. 4. FIG. 6 is a diagram showing signals that are input to stages of the gate driving circuit 130 illustrated in FIG. 4 and signals that are output from the stages.

The gate driving circuit 130 according to an embodiment may include a plurality of stages ST1 to STn (e.g., ST1, ST2, ST3, . . . , STn). The plurality of stages ST1 to STn may sequentially output gate signals GS[1] to GS[4n] to the gate lines. The number of stages provided in the gate driving circuit 130 may be variously changed according to the number of rows (horizontal lines) provided in the pixel portion 110.

Each of the plurality of stages ST1 to STn of the gate driving circuit 130 according to an embodiment may generate two or more gate signals corresponding to two or more rows and output the two or more gate signals to two or more gate lines corresponding to each of the plurality of stages ST1 to STn. According to an embodiment, as illustrated in FIG. 4, each of the plurality of stages ST1 to STn may generate four gate signals and sequentially output the four gate signals to four gate lines of four rows corresponding to each of the plurality of stages ST1 to STn. In this case, the number of stages may be ¼ of the number of rows (horizontal lines) provided in the pixel portion 110. For example, the first stage ST1 may sequentially output first to fourth gate signals GS[1] to GS[4] to first to fourth gate lines. The second stage ST2 may sequentially output fifth to eighth gate signals GS[5] to GS[8] to fifth to eighth gate lines. The third stage ST3 may sequentially output ninth to twelfth gate signals GS[9] to GS[12] to ninth to twelfth gate lines. The $n^{th}$ stage STn may output a $4n-3^{th}$ gate signal GS[4n-3] to a $4n^{th}$ gate signal GS[4n] to a $4n-3^{th}$ gate line to a $4n^{th}$ gate line.

Referring to FIGS. 4 and 5, each of the plurality of stages ST1 to STn of the gate driving circuit 130 may include a first input terminal IN1, a second input terminal IN2, a first voltage input terminal V1, a second voltage input terminal V2, a third voltage input terminal V3, a first clock terminal BCLK, a second clock terminal CCLK, a third clock terminal SCLK, a first control signal terminal SN1, a second control signal terminal SN2, a third control signal terminal SN3, a first output terminal OUT1, and a second output terminal OUT2.

The first output terminal OUT1 may be provided in plural to output a plurality of gate signals. For example, each stage may include four first output terminals OUT11 to OUT14 (e.g., OUT11, OUT12, OUT13, OUT14) to output four gate signals. The third clock terminal SCLK may be provided in plural to correspond to the plurality of first output terminals. For example, the third clock terminal SCLK of each stage may include four third clock terminals SCLK1 to SCLK4 (e.g., SCLK1, SCLK2, SCLK3, SCLK4).

Each of the plurality of stages ST1 to STn may generate a carry signal and may supply the carry signal (the second output signal) to the first input terminal IN1 of a next stage and the second input terminal IN2 of a previous stage.

A start signal STV or a carry signal (hereinafter, referred to as a "previous carry signal") output by a previous stage may be input to the first input terminal IN1. For example, the start signal STV may be input to the first input terminal IN1 of the first stage ST1, and the previous carry signal may be input to the first input terminal IN1 of each of the second to $n^{th}$ stages ST2 to STN as a start signal. The previous stage may include at least one previous stage. FIGS. 4 and 5 show examples where the previous stage corresponds to a directly previous stage. For example, as illustrated in FIG. 5, a carry signal CR[k-1] output from the k-1$^{th}$ stage may be input to the first input terminal IN1 of the k$^{th}$ stage STk as a start signal.

A carry signal (hereinafter, referred to as a "next carry signal") output by a next stage may be input to the second input terminal IN2. The next stage may include at least one next stage. FIGS. 4 and 5 show examples where the next stage corresponds to a directly next stage. For example, as illustrated in FIG. 5, a carry signal CR[k+1] output from the k+1$^{th}$ stage may be input to the second input terminal IN2 of the k$^{th}$ stage STk.

A first voltage VGH may be input to the first voltage input terminal V1, a second voltage VGL1 may be input to the second voltage input terminal V2, and a third voltage VGL2 may be input to the third voltage input terminal V3. In an embodiment, the second voltage VGL1 has a lower voltage level than the first voltage VGH. In an embodiment, the third voltage VGL2 has a lower voltage level than the second voltage VGL1. For example, the first voltage VGH may be 12V, the second voltage VGL1 may be −5V, and the third voltage VGL2 may be −9V. The first voltage VGH, the second voltage VGL1, and the third voltage VGL2 may be global signals and may be input from the controller 190 illustrated in FIG. 1 and/or from a power supply circuit.

A boosting clock signal BCK may be input to the first clock terminal BCLK. As illustrated in FIG. 6, the boosting clock signal BCK may include a first boosting clock signal BCK1 and a second boosting clock signal BCK2. The first boosting clock signal BCK1 or the second boosting clock signal BCK2 may be input to the first clock terminal BCLK. The first boosting clock signal BCK1 and the second boosting clock signal BCK2 may be alternately input to the first clock terminals BCLK of the stages ST1 to STn. For example, the first boosting clock signal BCK1 may be input to the first clock terminal BCLK of the odd-numbered stages ST1, ST3, . . . , etc. The second boosting clock signal BCK2 may be input to the first clock terminal BCLK of the even-numbered stages ST2, ST4, . . . , etc.

The first boosting clock signal BCK1 and the second boosting clock signal BCK2 may be square wave signals repeating a high-level voltage and a low-level voltage. The high-level voltage may be a gate-on voltage for turning on an N-type transistor, and the low-level voltage may be a gate-off voltage for turning off the N-type transistor. The first boosting clock signal BCK1 and the second boosting clock signal BCK2 may be signals having the same waveform and shifted phases. For example, the second boosting clock signal BCK2 may have the same waveform as the first boosting clock signal BCK1 and may be input by being phase-shifted (phase-delayed) at a predetermined interval.

The second boosting clock signal BCK2 may be half-cycle shifted compared to the first boosting clock signal BCK1. The first boosting clock signal BCK1 and the second boosting clock signal BCK2 may have a gate-on voltage period that is longer than a gate-off voltage period in one cycle. However, the disclosure is not limited thereto and the first boosting clock signal BCK1 and the second boosting clock signal BCK2 may have a gate-on voltage period that is the same as or shorter than a gate-off voltage period in one cycle. The gate-on voltage of the first boosting clock signal BCK1 and the second boosting clock signal BCK2 may be 12V, and the gate-off voltage of the first boosting clock signal BCK1 and the second boosting clock signal BCK2 may be −9V. However, the gate-on voltage and the gate-off voltage of the first boosting clock signal BCK1 and the second boosting clock signal BCK2 are not limited thereto.

During the display period DP, the first boosting clock signal BCK1 and the second boosting clock signal BCK2 may alternately be the gate-on voltage and the gate-off voltage, and during a portion of the vertical blank period VBP, for example, the sensing period SP, the first boosting clock signal BCK1 and the second boosting clock signal BCK2 may be the gate-on voltage. In an embodiment, the first boosting clock signal BCK1 and the second boosting clock signal BCK2 is constantly the gate-on voltage throughout the sensing period SP.

A carry clock signal CR_CK may be input to the second clock terminal CCLK. As illustrated in FIG. 6, the carry clock signal CR_CK may include a first carry clock signal CR_CK1 and a second carry clock signal CR_CK2. The first carry clock signal CR_CK1 or the second carry clock signal CR_CK2 may be input to the second clock terminal CCLK. The first carry clock signal CR_CK1 and the second carry clock signal CR_CK2 may be alternately input to the second clock terminals CCLK of the stages ST1 to STn. For example, the first carry clock signal CR_CK1 may be input to the second clock terminals CCLK of the odd-numbered stages ST1, ST3, . . . , etc. The second carry clock signal CR_CK2 may be input to the second clock terminals CCLK of the even-numbered stages ST2, ST4, . . . , etc.

The first carry clock signal CR_CK1 and the second carry clock signal CR_CK2 may be square wave signals repeating a high-level voltage and a low-level voltage. The first carry clock signal CR_CK1 and the second carry clock signal CR_CK2 may be signals having the same waveform and shifted phases. For example, the second carry clock signal CR_CK2 may have the same waveform as the first carry clock signal CR_CK1 and may be input by being phase-shifted (phase-delayed) at a predetermined interval. The second carry clock signal CR_CK2 may be half-cycle shifted compared to the first carry clock signal CR_CK1. The first carry clock signal CR_CK1 and the second carry clock signal CR_CK2 may have a gate-on voltage period which is shorter than a gate-off voltage period in one cycle. However, the disclosure is not limited thereto and the first carry clock signal CR_CK1 and the second carry clock signal CR_CK2 may have a gate-on voltage period which is the same as or longer than a gate-off voltage period in one cycle. The gate-on voltage of the first carry clock signal CR_CK1 and the second carry clock signal CR_CK2 may be 12V, and the gate-off voltage of the first carry clock signal CR_CK1 and the second carry clock signal CR_CK2 may be −9V. However, the gate-on voltage and the gate-off voltage of the first carry clock signal CR_CK1 and the second carry clock signal CR_CK2 are not limited thereto.

During the display period DP, the first carry clock signal CR_CK1 and the second carry clock signal CR_CK2 may alternate between the gate-on voltage and the gate-off voltage, and during the vertical blank period VBP, the first carry clock signal CR_CK1 and the second carry clock signal CR_CK2 may be the gate-off voltage. In an embodiment, the first carry clock signal CR_CK1 and the second carry clock signal CR_CK2 are constantly the gate-off voltage through the vertical blank period VBP.

The gate-on voltage period of the first boosting clock signal BCK1 may overlap the gate-on voltage period of the first carry clock signal CR_CK1. The gate-on voltage period of the second boosting clock signal BCK2 may overlap the gate-on voltage period of the second carry clock signal CR_CK2. The gate-on voltage period of the carry clock signal CR_CK may be shorter than the gate-on voltage period of the boosting clock signal BCK.

Each of the plurality of stages ST1 to STn may include the plurality of third clock terminals SCLK. One of a plurality of scan clock signals SC_CK may be input to each of the plurality of third clock terminals SCLK. Each of the plurality of stages ST1 to STn may include i third clock terminals SCK and may receive i scan clock signals SC_CK of 2i scan clock signals SC_CK. Here, i may be an integer that is at least 2.

According to an embodiment, each stage may include four third clock terminals SCLK1 to SCLK4, and one of four scan clock signals from among the total of eight scan clock signals, that is, first to eighth scan clock signals SC_CK1 to SC_CK8, may be input to each of the third clock terminals SCLK1 to SCLK4. For example, the first to fourth scan clock signals SC_CK1 to SC_CK4 may be sequentially input to the third clock terminals SCLK1 to SCLK4 of the odd-numbered stages ST1, ST3, . . . , etc. The fifth to eighth scan clock signals SC_CK5 to SC_CK8 may be sequentially input to the third clock terminals SCLK1 to SCLK4 of the even-numbered stages ST2, ST4, . . . , etc.

The total of eight scan clock signals, that is, the first to eighth scan clock signals SC_CK1 to SC_CK8, may be square wave signals repeatedly having a high-level voltage and a low-level voltage. The first to eighth scan clock signals SC_CK1 to SC_CK8 may be signals having the same waveform and shifted phases. The first to eighth scan clock signals SC_CK1 to SC_CK8 may be supplied to the gate driving circuit 130 with gate-on voltage periods being sequentially phase-shifted. The first to eighth scan clock signals SC_CK1 to SC_CK8 may have a gate-on voltage period that is set to be shorter than a gate-off voltage period in one cycle. However, the disclosure is not limited thereto, and the first to eighth scan clock signals SC_CK1 to SC_CK8 may have a gate-on voltage period that is set to be the same as or longer than a gate-off voltage period in one cycle. The gate-on voltage of the first to eighth scan clock signals SC_CK1 to SC_CK8 may be 12V, and the gate-off voltage of the first to eighth scan signals SC_CK1 to SC_CK8 may be −5V. However, the gate-on voltage and the gate-off voltage of the first to eighth scan clock signals SC_CK1 to SC_CK8 are not limited thereto.

During the display period DP, the first to eighth scan clock signals SC_CK1 to SC_CK8 may alternate between the gate-on voltage and the gate-off voltage, and during the sensing period SP of the vertical blank period VBP, the first to eighth scan clock signals SC_CK1 to SC_CK8 may be the gate-on voltage.

The gate-on voltage period of the boosting clock signal BCK may overlap the gate-on voltage periods of the four scan clock signals. As illustrated in FIG. 6, the first to fourth scan clock signals SC_CK1 to SC_CK4 may sequentially have the gate-on voltage during the gate-on voltage period of the first boosting clock signal BCK1. The fourth to eighth scan clock signals SC_CK4 to SC_CK8 may sequentially have the gate-on voltage during the gate-on voltage period of the second boosting clock signal BCK2. Thus, the plurality of gate signals may be stably output in correspondence to the plurality of scan clock signals in one stage.

A first control signal S1 may be input to the first control signal terminal SN1. The first control signal S1 may be selectively supplied, as the gate-on voltage, to stages corresponding to rows on which sensing is to be performed in a corresponding frame, so that a sensing node M (see FIG. 7) in the stages may be charged.

A second control signal S2 may be input to the second control signal terminal SN2. The second control signal S2 of the gate-on voltage may be supplied so that a voltage of the sensing node M charged by the first control signal S1 may be supplied to a first control node Q (see FIG. 7) in the stage.

A third control signal S3 may be input to the third control signal terminal SN3. The third control signal S3 may be supplied when an operation error of a display apparatus occurs and/or in order to initialize (reset) a voltage of the first control node Q and a second control node QB before and/or after the sensing period SP of the vertical blank period VBP. The third control signal S3 of the gate-on voltage may be supplied during a predetermined time period, so that the first control node Q in the stage may be set to a second level voltage and the second control node QB (see FIG. 7) may be set to a first level voltage.

The gate signal may be output from the first output terminal OUT1. Each of the plurality of stages ST1 to STn may include the plurality of first output terminals OUT1 and may output the plurality of gate signals that are sequentially shifted by a predetermined time period. Each gate signal may be supplied to the pixel through a gate line corresponding to the pixel.

The number of first output terminals OUT1 may be the same as the number of scan clock signals SC_CK that are input to the stage. For example, four scan clock signals SC_CK may be input to each of the plurality of stages ST1 to STn, and each stage may include four first output terminals, namely, $1^{st}$-1 to $1^{st}$-4 output terminals OUT11, OUT12, OUT13, and OUT14. As illustrated in FIG. 5, a $p^{th}$ gate signal GS[p] from the $1^{st}$-1 output terminal OUT11 of the $k^{th}$ stage STk may be output to a $p^{th}$ gate line, a p+$1^{th}$ gate signal GS[p+1] from the $1^{st}$-2 output terminal OUT12 may be output to a p+$1^{th}$ gate line, a p+$2^{th}$ gate signal GS[p+2] from the $1^{st}$-3 output terminal OUT13 may be output to a p+$2^{th}$ gate line, and a p+$3^{th}$ gate signal GS[p+3] from the $1^{st}$-4 output terminal OUT14 may be output to a p+$3^{th}$ gate line. Here, p may be a positive integer, and p+3 may be 4 k.

A carry signal may be output from the second output terminal OUT2. Carry signals CR[1], CR[2], CR[3], . . . , CR[n] output from the second output terminals OUT2 of the stages ST1 to STn may be sequentially shifted by a predetermined period. The carry signal may be supplied to the first input terminal IN1 of the next stage and the second input terminal IN2 of the previous stage.

The gate driving circuit 130 may further include at least one previous dummy stage at a previous-end of the first stage ST1 and may further include at least one next dummy stage at a next-end of the $n^{th}$ stage STn.

The previous dummy stage may generate the carry signal in response to the start signal STV and output the carry signal to the next stage. For example, the gate driving circuit 130 may include one previous dummy stage, and the previous dummy stage may generate the carry signal in response to the start signal STV and may supply the generated carry signal to the first input terminal IN1 of the first stage ST1.

The next dummy stage may receive the carry signal output by the previous stage as a start signal and may generate the carry signal and output the generated carry signal to the previous stage. For example, the gate driving circuit 130 may include one next dummy stage, and the next dummy stage may generate the carry signal in response to the carry signal input from the previous stage (for example, the $n^{th}$ stage STn) and provide the generated carry signal to the second input terminal IN2 of the $n^{th}$ stage STn.

Figure 7:
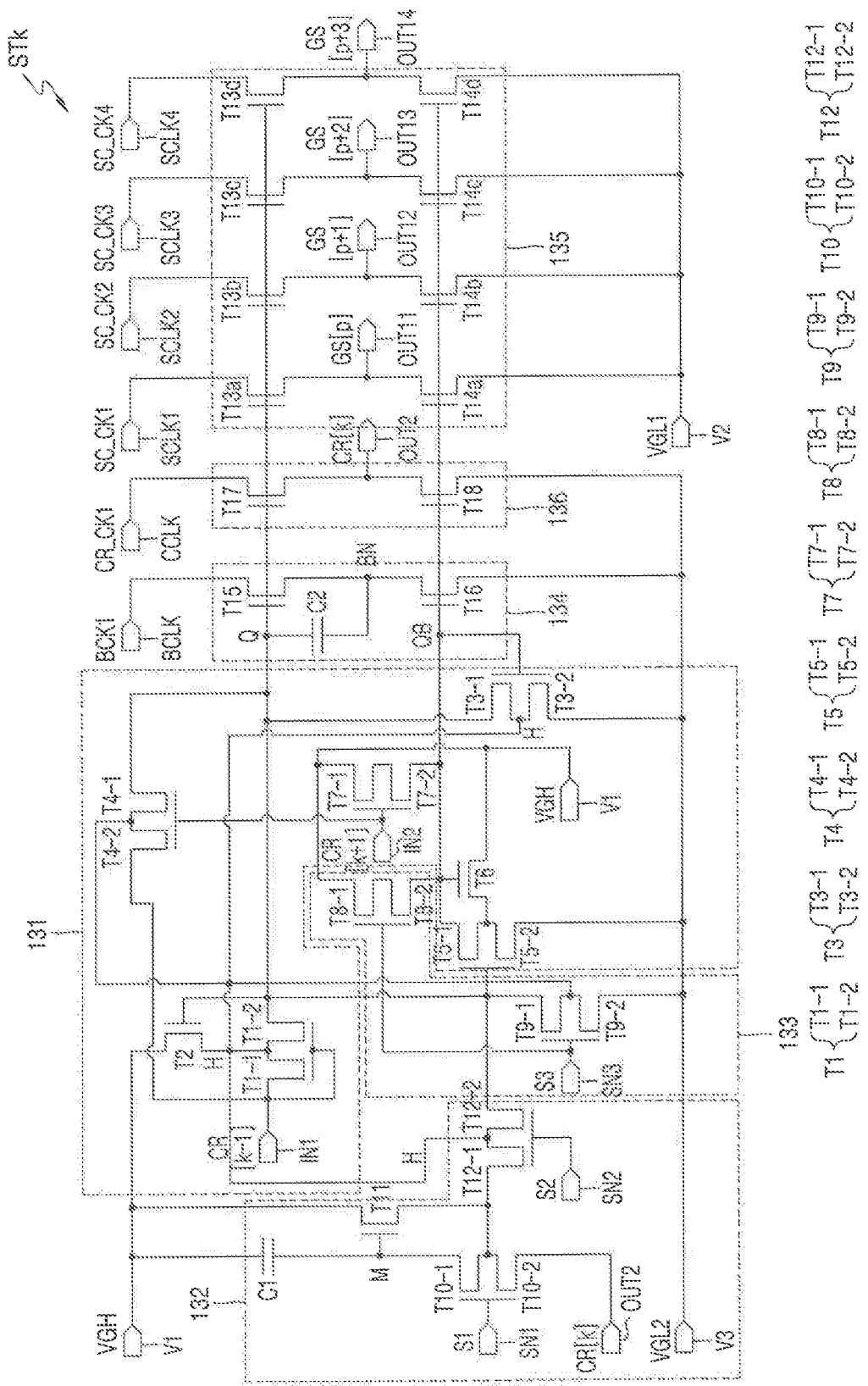
FIG. 7 is a circuit diagram of an example of a stage included in a gate driving circuit according to an embodiment.
Figure 8:
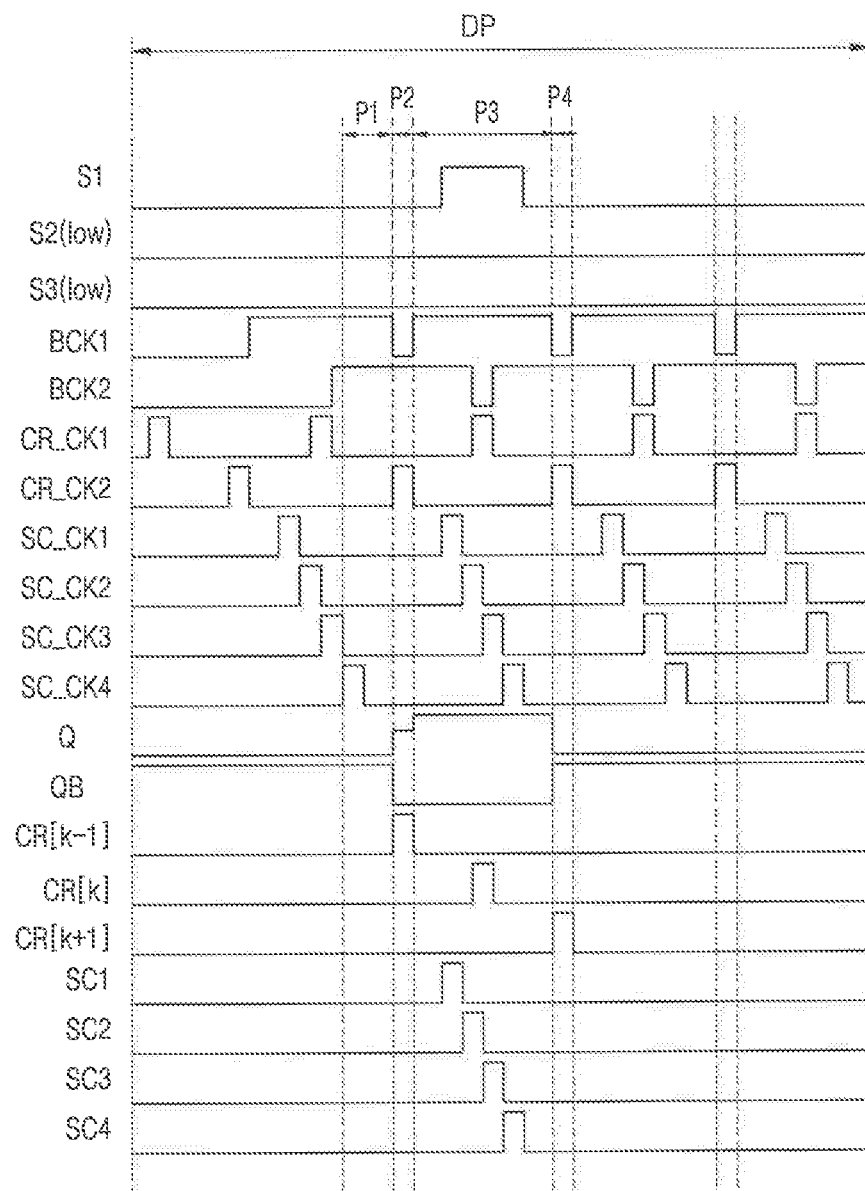
FIGS. 8 and 9 are diagrams showing signals for describing an operation of the stage of FIG. 7.
Figure 9:
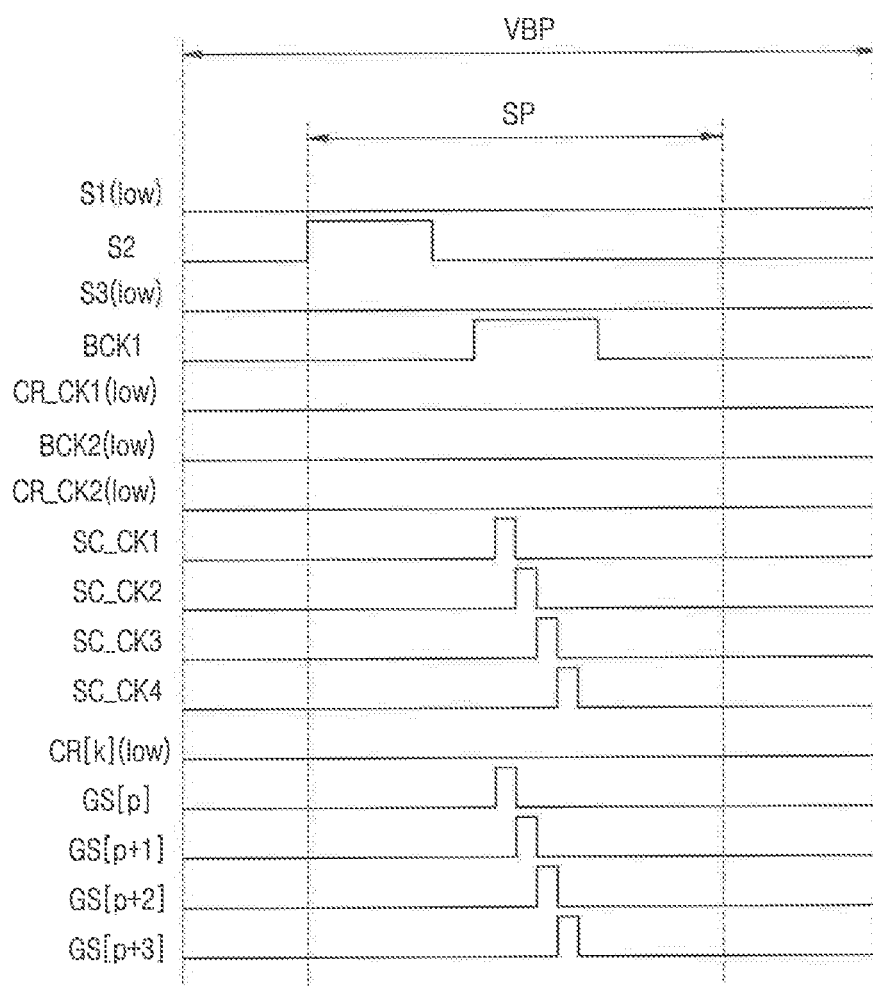
Figure 10:
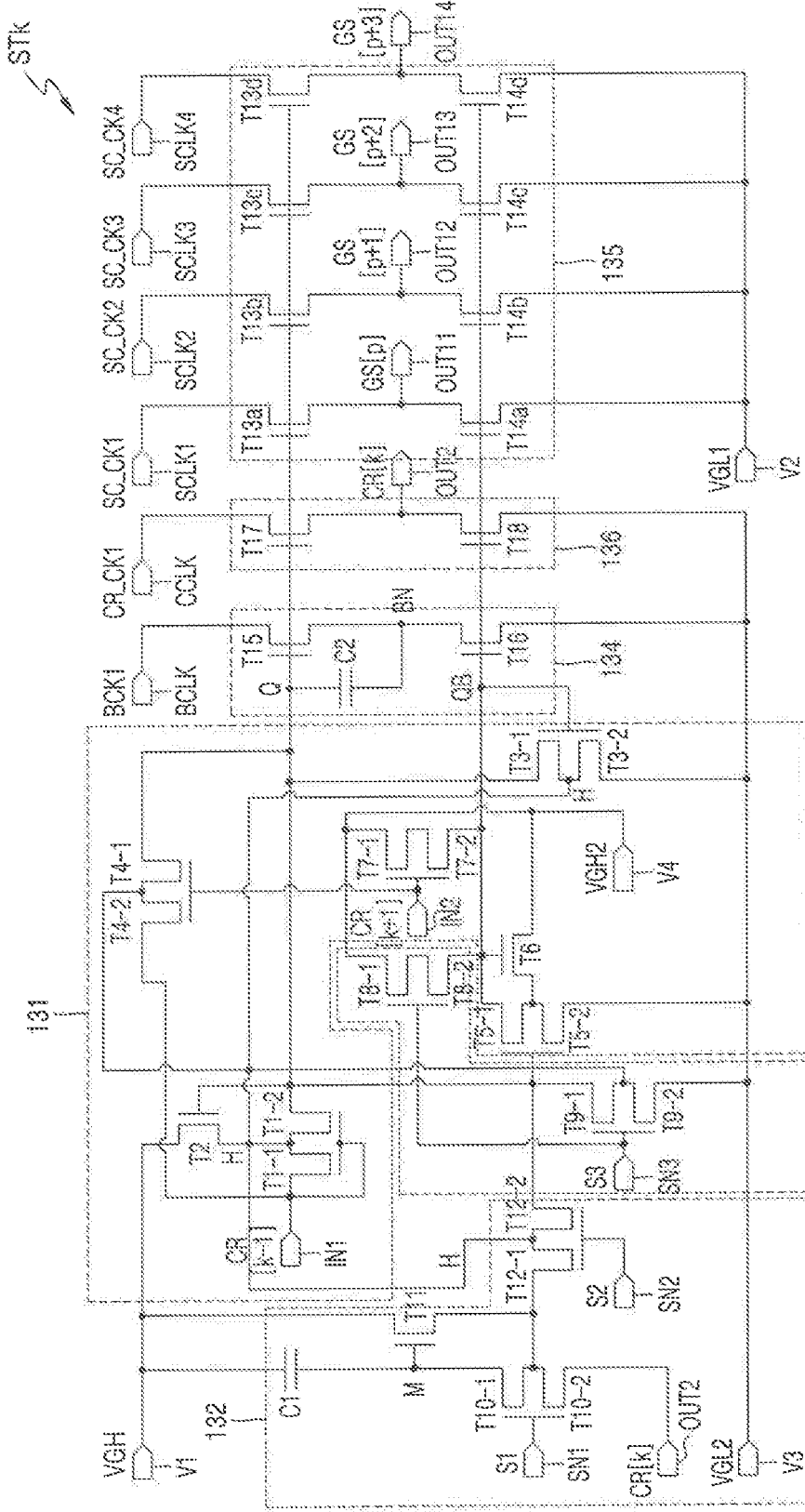
FIG. 10 is a circuit diagram of an example of a stage included in a gate driving circuit according to an embodiment.
Figure 11:
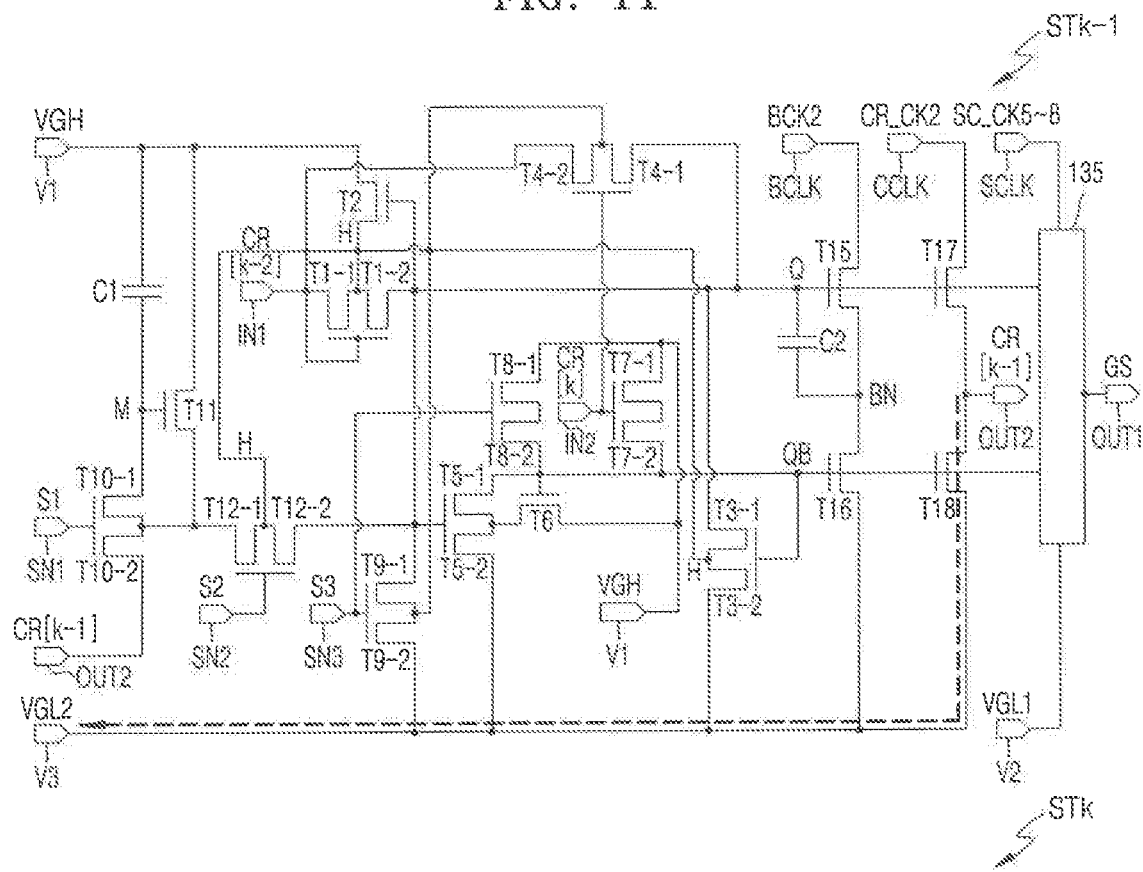
FIG. 11 is a diagram for describing an operation of a fourth transistor in the stage of FIG. 7.
Figure 11:
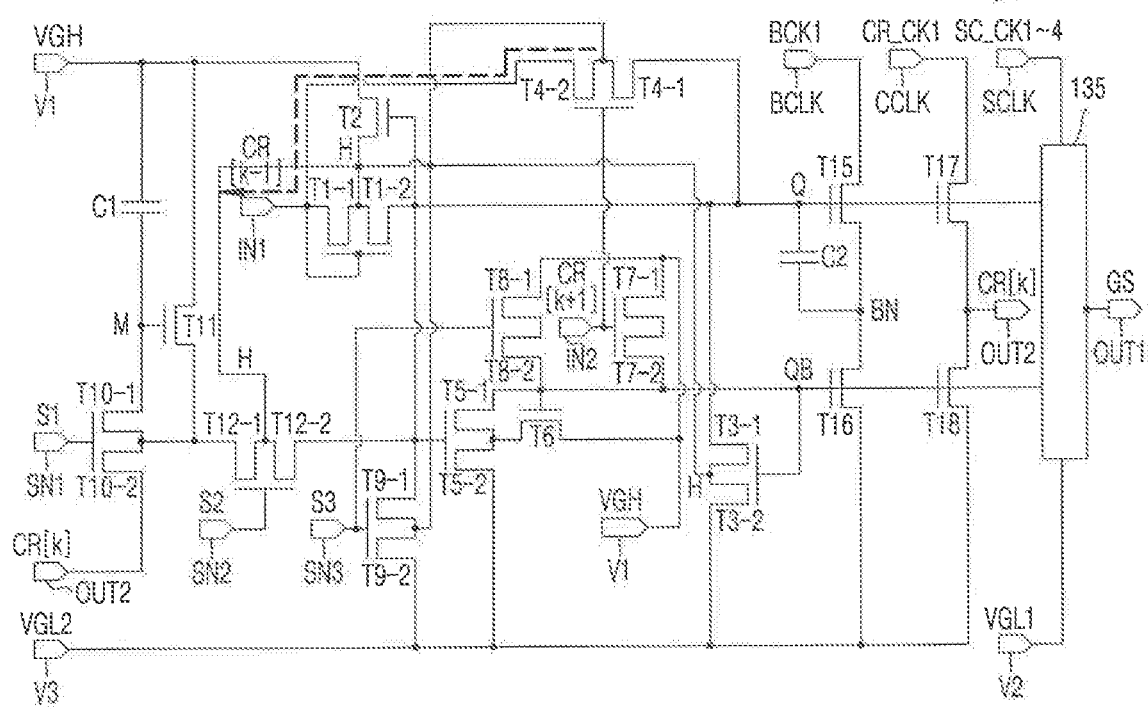

FIG. 7 is a circuit diagram of an example of a stage included in a gate driving circuit according to an embodiment. FIGS. 8 and 9 are diagrams showing signals for describing an operation of the stage of FIG. 7. FIG. 10 is a circuit diagram of an example of a stage included in a gate driving circuit according to an embodiment. FIG. 11 is a diagram for describing an operation of a fourth transistor in the stage of FIG. 7.

Each of the stages ST1 to STn may have a plurality of nodes. Hereinafter, some of the plurality of nodes are referred to as the sensing node M, the first control node Q, and the second control node QB. According to an embodiment, a plurality of transistors included in a circuit of each of the first to $n^{th}$ stages ST1 to STn is the same as the transistors included in the pixel circuit illustrated in FIG. 2. For example, the plurality of transistors included in the circuit of each of the first to $n^{th}$ stages ST1 to STn may include N-type oxide thin-film transistors including a semiconductor layer including an amorphous or crystalline oxide semiconductor. The oxide semiconductor may include an IGZO semiconductor or an ITGZO semiconductor.

In odd-numbered stages, the first boosting clock signal BCK1 may be supplied to the first clock terminal BCLK, the first carry clock signal CR_CK1 may be supplied to the second clock terminal CCLK, and the first to fourth scan clock signals SC_CK1 to SC_CK4 may be supplied to the third clock terminals SCLK1 to SCLK4. In even-numbered stages, the second boosting clock signal BCK2 may be supplied to the first clock terminal BCLK, the second carry clock signal CR_CK2 may be supplied to the second clock terminal CCLK, and the fifth to eighth scan clock signals SC_CK5 to SC_CK8 may be supplied to the third clock terminals SCLK1 to SCLK4.

Hereinafter, the $k^{th}$ stage STk (hereinafter, referred to as the $k^{th}$ stage STk) corresponding to the $k^{th}$ row of the pixel portion 110 is described as an example. The $k^{th}$ stage STk may receive, as a start signal, the k−$1^{th}$ carry signal CR[k−1] from the k−$1^{th}$ stage, which is the previous stage, and may output the $p^{th}$ to p+$3^{th}$ gate signals GS[p], GS[p+1], GS[p+2], and GS[p+3] to the gate lines of the $p^{th}$ to p+$3^{th}$ rows. For convenience of explanation, the example where the $k^{th}$ stage STk may be the odd-numbered stage, the first boosting clock signal BCK1 may be supplied to the first clock terminal BCLK, the first carry clock signal CR_CK1 may be supplied to the second clock terminal CCLK, and the first to fourth scan clock signals SC_CK1 to SC_CK4 may be supplied to the third clock terminals SCLK1 to SCLK4 is described. When k is 1, the first stage ST1 may receive the start signal STV through the first input terminal IN.

Hereinafter, for convenience of explanation, to supply an arbitrary signal may denote that a gate-on voltage (for example, a first level voltage that is a high-level voltage) is supplied, and not to supply an arbitrary signal may denote that a gate-off voltage (for example, a second level voltage that is a low-level voltage) is supplied. A first voltage VGH may be the first level voltage, and a second voltage VGL1 and a third voltage VGL2 may be the second level voltage.

Referring to FIG. 7, the $k^{th}$ stage STk may include a first control circuit 131, a second control circuit 132, an initialization circuit 133, a boosting circuit 134, a first output circuit 135, and a second output circuit 136.

The first control circuit 131 may control voltages of the first control node Q and the second control node QB, in response to signals that are input to the first input terminal IN1 and the second input terminal IN2. For example, the first control circuit 131 may control the voltages of the first control node Q and the second control node QB, in response to the previous carry signal CR[k−1] and the next carry signal CR[k+1]. The first control circuit 131 may include first to seventh transistors T1 to T7. The first control circuit 131 may include a first circuit configured to control the voltage of the first control node Q and a second circuit configured to control the voltage of the second control node QB.

The first circuit may include the first transistor T1, the second transistor T2, the third transistor T3, and the fourth transistor T4.

The first transistor T1 may be connected between the first input terminal IN1 and the first control node Q. In an embodiment, the first transistor T1 includes a plurality of sub-transistors that are connected in series. The sub-transistors may include a pair of $1^{st}$-1 transistor T1-1 and $1^{st}$-2 transistor T1-2. Gates of the $1^{st}$-1 transistor T1-1 and the $1^{st}$-2 transistor T1-2 may be connected to the first input terminal IN1. The $1^{st}$-1 transistor T1-1 and the $1^{st}$-2 transistor T1-2 may be turned on when the previous carry signal CR[k−1] is supplied and may set the voltage of the first control node Q to a voltage of the previous carry signal CR[k−1].

The second transistor T2 may be connected between the first voltage input terminal V1 and a first node H. A gate of the second transistor T2 may be connected to the first control node Q. An intermediate node (a common electrode) between the $1^{st}$-1 transistor T1-1 and the $1^{st}$-2 transistor T1-2 may be connected to the first node H. The second transistor T2 may be turned on when the first control node Q is the first level voltage and may set the intermediate node between the $1^{st}$-1 transistor T1-1 and the $1^{st}$-2 transistor T1-2 to the first voltage VGH. Accordingly, it is possible to prevent a voltage drop of the first control node Q due to leakage current of the first transistor T1 when the first transistor T1 is turned off.

The third transistor T3 may be connected between the first control node Q and the third voltage input terminal V2. In an embodiment, the third transistor T3 includes a plurality of sub-transistors that are connected in series. The sub-transistors may include a pair of $3^{rd}$-1 transistor T3-1 and $3^{rd}$-2 transistor T3-2. Gates of the $3^{rd}$-1 transistor T3-1 and the $3^{rd}$-2 transistor T3-2 may be connected to the second control node QB. An intermediate node (a common electrode) between the $3^{rd}$-1 transistor T3-1 and the $3^{rd}$-2 transistor T3-2 may be connected to the first node H and may be set to the first voltage VGH transmitted through the second transistor T2. The $3^{rd}$-1 transistor T3-1 and the $3^{rd}$-2 transistor T3-2 may be turned on when the second control node QB is the first level voltage and may set the first control node Q to the third voltage VGL2.

The fourth transistor T4 may be connected between the first input terminal IN1 and the first control node Q. In an embodiment, the fourth transistor T4 includes a plurality of sub-transistors that are connected in series. The sub-transistors may include a pair of $4^{th}$-1 transistor T4-1 and $4^{th}$-2 transistor T4-2. Gates of the $4^{th}$-1 transistor T4-1 and the $4^{th}$-2 transistor T4-2 may be connected to the second input terminal IN2. An intermediate node (a common electrode) between the $4^{th}$-1 transistor T4-1 and the $4^{th}$-2 transistor T4-2 may be connected to the first node H and may be set as the first voltage VGH transmitted through the second transistor T2. The $4^{th}$-1 transistor T4-1 and the $4^{th}$-2 transistor T4-2 may be turned on when the next carry signal CR[k+1] is supplied and may set the voltage of the first control node Q to the voltage of the previous carry signal CR[k−1].

The second circuit may include the fifth transistor T5, the sixth transistor T6, and the seventh transistor T7.

The fifth transistor T5 may be connected between the second control node QB and the third voltage input terminal V3. In an embodiment, the fifth transistor T5 includes a plurality of sub-transistors that are connected in series. The sub-transistors may include a pair of $5^{th}$-1 transistor T5-1 and $5^{th}$-2 transistor T5-2. Gates of the $5^{th}$-1 transistor T5-1 and the $5^{th}$-2 transistor T5-2 may be connected to the first control node Q. The $5^{th}$-1 transistor T5-1 and the $5^{th}$-2 transistor T5-2 may be turned on when the first control node Q is the first level voltage and may set the voltage of the second control node QB to the third voltage VGL2.

The sixth transistor T6 may be connected between the first voltage input terminal V1 and an intermediate node (a common electrode) between the $5^{th}$-1 transistor T5-1 and the $5^{th}$-2 transistor T5-2. A gate of the sixth transistor T6 may be connected to the second control node QB. The sixth transistor T6 may be turned on when the second control node QB is the first level voltage and may set the intermediate node between the $5^{th}$-1 transistor T5-1 and the $5^{th}$-2 transistor T5-2 to the first voltage VGH.

The seventh transistor T7 may be connected between the first voltage input terminal V1 and the second control node QB. In an embodiment, the seventh transistor T7 includes a plurality of sub-transistors that are connected in series. The sub-transistors may include a pair of $7^{th}$-1 transistor T7-1 and $7^{th}$-2 transistor T7-2. Gates of the $7^{th}$-1 transistor T7-1 and the $7^{th}$-2 transistor T7-2 may be connected to the second input terminal IN2. The $7^{th}$-1 transistor T7-1 and the $7^{th}$-2 transistor T7-2 may be turned on when the next carry signal CR[k+1] is supplied and may set the voltage of the second control node QB to the first voltage VGH.

The second control circuit 132 may supply the first voltage VGH to the first control node Q and the third voltage VGL2 to the second control node QB for sensing state information of the pixel PX.

The second control circuit 132 may control the voltages of the first control node Q and the second control node QB in response to signals that are input to the first control signal terminal SN1 and the second control signal terminal SN2. For example, the second control circuit 132 may control the voltages of the first control node Q and the second control node QB in response to the first control signal S1 and the second control signal S2. The second control circuit 132 may include tenth to twelfth transistors T10 to T12 and a first capacitor C1.

The first control signal S1 may be supplied at an arbitrary timing during the display period DP. For example, the first control signal S1 may be supplied at an output timing of the $k^{th}$ carry signal CR[k]. The $k^{th}$ carry signal CR[k] may be supplied during the display period DP to charge the sensing node M for performing pixel sensing. The second control signal S2 may be supplied during the sensing period SP of the vertical blank period VBP to supply the first voltage VGH to the first control node Q for performing pixel sensing.

The tenth transistor T10 may be connected between the sensing node M and the second output terminal OUT2. The tenth transistor T10 may be turned on by the first control signal S1 synchronized to the carry signal output by the second output circuit 136. In an embodiment, the tenth transistor T10 includes a plurality of sub-transistors that are connected in series. The sub-transistors may include a pair of $10^{th}$-1 transistor T10-1 and $10^{th}$-2 transistor T10-2. Gates of the $10^{th}$-1 transistor T10-1 and the $10^{th}$-2 transistor T10-2 may be connected to the first control signal terminal SN1. The $10^{th}$-1 transistor T10-1 and the $10^{th}$-2 transistor T10-2 may be turned on when the first control signal S1 is supplied and may set a voltage of the sensing node M as a voltage of the $k^{th}$ carry signal CR[k].

The eleventh transistor T11 may be connected between the first voltage input terminal V1 and an intermediate node (a common electrode) between the $10^{th}$-1 transistor T10-1 and the $10^{th}$-2 transistor T10-2. A gate of the eleventh transistor T11 may be connected to the second node M. The eleventh transistor T11 may be turned on when the sensing node M is the first level voltage and may set the intermediate node between the $10^{th}$-1 transistor T10-1 and the $10^{th}$-2 transistor T10-2 to the first voltage VGH.

The twelfth transistor T12 may be connected between the intermediate node between the $10^{th}$-1 transistor T10-1 and the $10^{th}$-2 transistor T10-2 and the first control node Q. The twelfth transistor T12 may be connected between the eleventh transistor T11 and the first control node Q. In an embodiment, the twelfth transistor T12 includes a plurality of sub-transistors that are connected in series. The sub-transistors may include a pair of $12^{th}$-1 transistor T12-1 and $12^{th}$-2 transistor T12-2. Gates of the $12^{th}$-1 transistor T12-1 and the $12^{th}$-2 transistor T12-2 may be connected to the second control signal terminal SN2. The $12^{th}$-1 transistor T12-1 and the $12^{th}$-2 transistor T12-2 may be turned on when the second control signal S2 is supplied and may electrically connect the eleventh transistor T11 with the first control node Q. An intermediate node (a common electrode) between the $12^{th}$-1 transistor T12-1 and the $12^{th}$-2 transistor T12-2 may be connected to the first node H and may be set to the first voltage VGH transmitted through the second transistor T2. Accordingly, it is possible to prevent a voltage drop of the first control node Q due to leakage current of the twelfth transistor T12 when the twelfth transistor T12 is turned off.

The first capacitor C1 may be connected between the first voltage input terminal V1 and the sensing node M. When the sensing node M is set to the first level voltage of the $k^{th}$ carry signal CR[k], the first capacitor C1 may store a difference between the first voltage VGH and a voltage of the gate of the eleventh transistor T11.

The initialization circuit 133 may initialize the voltages of the first control node Q and the second control node QB in response to a signal that is input to the third control signal terminal SN3. For example, the initialization circuit 133 may control the voltages of the first control node Q and the second control node QB in response to the third control signal S3. The initialization circuit 133 may include an eighth transistor T8 and a ninth transistor T9.

The eighth transistor T8 may be connected between the first voltage input terminal V1 and the second control node QB. In an embodiment, the eighth transistor T8 includes a plurality of sub-transistors that are connected in series. The sub-transistors may include a pair of $8^{th}$-1 transistor T8-1 and $8^{th}$-2 transistor T8-2. Gates of the $8^{th}$-1 transistor T8-1 and the $8^{th}$-2 transistor T8-2 may be connected to the third control signal terminal SN3. The $8^{th}$-1 transistor T8-1 and the $8^{th}$-2 transistor T8-2 may be turned on when the third control signal S3 is supplied and may set the voltage of the second control node QB to the first voltage VGH.

The ninth transistor T9 may be connected between the first control node Q and the third voltage input terminal V3. In an embodiment, the ninth transistor T9 includes a plurality of sub-transistors that are connected in series. The sub-transistors may include a pair of $9^{th}$-1 transistor T9-1 and $9^{th}$-2 transistor T9-2. Gates of the $9^{th}$-1 transistor T9-1 and the $9^{th}$-2 transistor T9-2 may be connected to the third control signal terminal SN3. An intermediate node (a common electrode) between the $9^{th}$-1 transistor T9-1 and the $9^{th}$-2 transistor T9-2 may be connected to the first node H and may be set to the first voltage VGH transmitted through the second transistor T2. The $9^{th}$-1 transistor T9-1 and the $9^{th}$-2 transistor T9-2 may be turned on when the third control signal S3 is supplied and may set the voltage of the first control node Q to the third voltage VGL2.

The boosting circuit 134 may boost the voltage of the first control node Q in response to a signal that is input to the first clock terminal BCLK. For example, the boosting circuit 134 may boost the voltage of the first control node Q in response to the first boosting clock signal BCK1. The boosting circuit 134 may include a fifteenth transistor T15, a sixteenth transistor T16, and a second capacitor C2.

The fifteenth transistor T15 may be connected between the first clock terminal BCLK and a second node BN. A gate of the fifteenth transistor T15 may be connected to the first control node Q. The fifteenth transistor T15 may be turned on or turned off according to the voltage of the first control node Q. The fifteenth transistor T15 may be turned on when the first control node Q is set to the first level voltage and may transmit a first level voltage of the first boosting clock signal BCK1 to the second node BN.

The sixteenth transistor T16 may be connected between the second node BN and the third voltage input terminal V3. A gate of the sixteenth transistor T16 may be connected to the second control node QB. The sixteenth transistor T16 may be turned on or turned off according to the voltage of the second control node QB. The sixteenth transistor T16 may be turned on when the second control node QB is set to the first level voltage and may transmit the third voltage VGL2 to the second node BN.

The second capacitor C2 may be connected between the first control node Q and the second node BN. The voltage of the first control node Q may be changed by the second capacitor C2 according to a change of a voltage of the second node BN. When the fifteenth transistor T15 is turned on when the first control node Q is the first voltage level and the first boosting clock signal BCK1 of the first level voltage is output to the second node BN, the voltage of the first control node Q may be boosted by the second capacitor C2. Because the voltage of the first control node Q is boosted while the plurality of gate signals are being output, stable multi-outputting operations of the gate signals may become possible.

The first output circuit 135 may output the scan clock signal SC_CK or the second voltage VGL1 to the first output terminal OUT1 according to the voltages of the first control node Q and the second control node QB. The first output circuit 135 may include a plurality of sub-output circuits, and one of a plurality of scan clock signals may be input to a third clock terminal of each of the plurality of sub-output circuits. The plurality of scan clock signals may have the same waveforms and have phases shifted by a predetermined interval. According to an embodiment, the first output circuit 135 may include a plurality of first to fourth sub-output circuits. Each of the first to fourth sub-output circuits may include a thirteenth transistor and a fourteenth transistor. The thirteenth transistor may be a pull-up transistor configured to transmit a first level voltage to an output terminal. The fourteenth transistor may be a pull-down transistor configured to transmit a second level voltage to an output terminal.

The first sub-output circuit may include a $13^{th}$-1 transistor T13a and a $14^{th}$-1 transistor T14a. The $13^{th}$-1 transistor T13a may be connected between the $3^{rd}$-1 clock terminal SCLK1 and the $1^{st}$-1 output terminal OUT11. A gate of the $13^{th}$-1 transistor T13a may be connected to the first control node Q. The $13^{th}$-1 transistor T13a may be turned on or turned off according to the voltage of the first control node Q. The $13^{th}$-1 transistor T13a may be turned on when the first control node Q is set to the first level voltage and may output the first scan clock signal SC_CK1 of the first level voltage as the $p^{th}$ gate signal GS[p] of the first level voltage or output the first scan clock signal SC_CK1 of the second level voltage as the $p^{th}$ gate signal GS[p] of the second level voltage. The $14^{th}$-1 transistor T14a may be connected between the $1^{st}$-1 output terminal OUT11 and the second voltage input terminal V2. A gate of the $14^{th}$-1 transistor T14a may be connected to the second control node QB. The $14^{th}$-1 transistor T14a may be turned on or turned off according to the voltage of the second control node QB. The $14^{th}$-1 transistor T14a may be turned on when the second control node QB is set to the first level voltage and may output the second voltage VGL1 as the $p^{th}$ gate signal GS[p] of the second level voltage.

The second sub-output circuit may include a $13^{th}$-2 transistor T13b and a $14^{th}$-2 transistor T14b. The $13^{th}$-2 transistor T13b may be connected between the $3^{rd}$-2 clock terminal SCLK2 and the $1^{st}$-2 output terminal OUT12. A gate of the $13^{th}$-2 transistor T13b may be connected to the first control node Q. The $13^{th}$-2 transistor T13b may be turned on or turned off according to the voltage of the first control node Q. The $13^{th}$-2 transistor T13b may be turned on when the first control node Q is set to the first level voltage and may output the second scan clock signal SC_CK2 of the first level voltage as the $p+1^{th}$ gate signal GS[p+1] of the first level voltage or output the second scan clock signal SC_CK2 of the second level voltage as the $p+1^{th}$ gate signal GS[p+1] of the second level voltage. The $14^{th}$-2 transistor T14b may be connected between the $1^{st}$-2 output terminal OUT12 and the second voltage input terminal V2. A gate of the $14^{th}$-2 transistor T14b may be connected to the second control node QB. The $14^{th}$-2 transistor T14b may be turned on or turned off according to the voltage of the second control node QB. The $14^{th}$-2 transistor T14b may be turned on when the second control node QB is set to the first level voltage and may output the second voltage VGL1 as the $p+1^{th}$ gate signal GS[p+1] of the second level voltage.

The third sub-output circuit may include a $13^{th}$-3 transistor T13c and a $14^{th}$-3 transistor T14c. The $13^{th}$-3 transistor T13c may be connected between the $3^{rd}$-3 clock terminal SCLK3 and the $1^{st}$-3 output terminal OUT13. A gate of the $13^{th}$-3 transistor T13c may be connected to the first control node Q. The $13^{th}$-3 transistor T13c may be turned on or turned off according to the voltage of the first control node Q. The $13^{th}$-3 transistor T13c may be turned on when the first control node Q is set to the first level voltage and may output the third scan clock signal SC_CK3 of the first level voltage as the $p+2^{th}$ gate signal GS[p+2] of the first level voltage or output the third scan clock signal SC_CK3 of the second level voltage as the $p+2^{th}$ gate signal GS[p+2] of the second level voltage. The $14^{th}$-3 transistor T14c may be connected between the $1^{st}$-3 output terminal OUT13 and the second voltage input terminal V2. A gate of the $14^{th}$-3 transistor T14c may be connected to the second control node QB. The $14^{th}$-3 transistor T14c may be turned on or turned off according to the voltage of the second control node QB. The $14^{th}$-3 transistor T14c may be turned on when the second control node QB is set to the first level voltage and may output the second voltage VGL1 as the $p+2^{th}$ gate signal GS[p+2] of the second level voltage.

The fourth sub-output circuit may include a $13^{th}$-4 transistor T13d and a $14^{th}$-4 transistor T14d. The $13^{th}$-4 transistor T13d may be connected between the $3^{rd}$-4 clock terminal SCLK4 and the $1^{st}$-4 output terminal OUT14. A gate of the $13^{th}$-4 transistor T13d may be connected to the first control node Q. The $13^{th}$-4 transistor T13d may be turned on or turned off according to the voltage of the first control node Q. The $13^{th}$-4 transistor T13d may be turned on when the first control node Q is set to the first level voltage and may output the fourth scan clock signal SC_CK4 of the first level voltage as the $p+3^{th}$ gate signal GS[p+3] of the first level voltage or output the fourth scan clock signal SC_CK4 of the second level voltage as the $p+3^{th}$ gate signal GS[p+3] of the second level voltage. The $14^{th}$-4 transistor T14d may be connected between the $1^{st}$-4 output terminal OUT14 and the second voltage input terminal V2. A gate of the $14^{th}$-4 transistor T14d may be connected to the second control node QB. The $14^{th}$-4 transistor T14d may be turned on or turned off according to the voltage of the second control node QB. The $14^{th}$-4 transistor T14d may be turned on when the second control node QB is set to the first level voltage and may output the second voltage VGL1 as the $p+3^{th}$ gate signal GS[p+3] of the second level voltage.

The second output circuit 136 may output the first carry clock signal CR_CK1 or the third voltage VGL2 to the second output terminal OUT2 according to the voltages of the first control node Q and the second control node QB. The second output circuit 136 may include a seventeenth transistor T17 and an eighteenth transistor T18 connected between the second clock terminal CCLK and the third voltage input terminal V3.

The seventeenth transistor T17 may be connected between the second clock terminal CCLK and the second output terminal OUT2. A gate of the seventeenth transistor T17 may be connected to the first control node Q. The seventeenth transistor T17 may be a pull-up transistor configured to transmit a first level voltage to an output terminal. The seventeenth transistor T17 may be turned on or turned off according to the voltage of the first control node Q. The seventeenth transistor T17 may be turned on when the first control node Q is set to the first level voltage and may output the first carry clock signal CR_CK1 of the first level voltage as the $k^{th}$ carry signal CR[k] of the first level voltage or output the first carry clock signal CR_CK1 of the second level voltage as the $k^{th}$ carry signal CR[k] of the second level voltage.

The eighteenth transistor T18 may be connected between the second output terminal OUT2 and the third voltage input terminal V3. A gate of the eighteenth transistor T18 may be connected to the second control node QB. The eighteenth transistor T18 may be a pull-down transistor configured to transmit a second level voltage to an output terminal. The eighteenth transistor T18 may be turned on or turned off according to the voltage of the second control node QB. The eighteenth transistor T18 may be turned on when the second control node QB is set to the first level voltage and may output the third voltage VGL2 as the $k^{th}$ carry signal CR[k] of the second level voltage.

According to the embodiment described above, a terminal of each of the sixth transistor T6, the seventh transistor T7, and the eighth transistor T8 is connected to the first voltage input terminal V1. However, embodiments of the disclosure are not limited thereto. According to another embodiment, as illustrated in FIG. 10, a terminal of each of the sixth transistor T6, the seventh transistor T7, and the eighth transistor T8 may be connected to a fourth voltage input terminal V4 to which a fourth voltage VGH2 is supplied. In an embodiment, the fourth voltage VGH2 has a lower voltage level than the first voltage VGH. For example, the fourth voltage VGH2 may be 3V.

In FIG. 10, the sixth transistor T6 may be connected between the fourth voltage input terminal V4 and an intermediate node (a common electrode) between the $5^{th}$-1 transistor T5-1 and the $5^{th}$-2 transistor T5-2. The sixth transistor T6 may be turned on when the second control node QB is the first level voltage and may set the intermediate node between the $5^{th}$-1 transistor T5-1 and the $5^{th}$-2 transistor T5-2 as the fourth voltage VGH2.

In FIG. 10, the seventh transistor T7 may be connected between the fourth voltage input terminal V4 and the second control node QB. The seventh transistor T7 may be turned on when the next carry signal CR[k+1] is supplied and may set the voltage of the second control node QB to the fourth voltage VGH2.

In FIG. 10, the eighth transistor T8 may be connected between the fourth voltage input terminal V4 and the second control node QB. The eighth transistor T8 may be turned on when the third control signal S3 is supplied and may set the voltage of the second control node QB to the fourth voltage VGH2.

Hereinafter, an operation of the $k^{th}$ stage STk will be described by referring to FIGS. 8 and 9.

FIG. 8 illustrates the operation of the $k^{th}$ stage STk during the display period DP according to an embodiment.

During a first period P1, the previous carry signal CR[k−1] of the second level voltage is supplied from the $k-1^{th}$ stage (i.e., the previous stage), the next carry signal CR[k+1] of the second level voltage is supplied from the $k+1^{th}$ stage (i.e., the next stage), the first boosting clock signal BCK1 of the first level voltage is supplied, and the first carry clock signal CR_CK1 of the second level voltage is supplied. The first control node Q may maintain the second level voltage and the second control node QB may maintain the first level voltage.

During a second period P2, the previous carry signal CR[k−1] of the first level voltage is supplied as a start signal. The next carry signal CR[k+1] of the second level voltage is supplied, the first boosting clock signal BCK1 and the first carry clock signal CR_CK1 of the second level voltage is supplied, and the first to fourth scan clock signals SC_CK1 to SC_CK4 of the second level voltage are supplied.

The first transistor T1 may be turned on by the previous carry signal CR[k−1] of the first level voltage, and the first control node Q may be set as the first level voltage of the previous carry signal CR[k−1]. Accordingly, the $13^{th}$-1 to $13^{th}$-4 transistors T13a, T13b, T13c, and T13d may be turned on, and the first to fourth scan clock signals SC_CK1, SC_CK2, SC_CK3, and SC_CK4 of the second level voltage may be output from each of the $1^{st}$-1 to $1^{st}$-4 output terminals OUT11 to OUT14 as the $p^{th}$ to $p+3^{th}$ gate signals GS[p] to GS[p+3] of the second level voltage. The seventeenth transistor T17 may be turned on, and the first carry clock signal CR_CK1 of the second level voltage may be output from the second output terminal OUT2 as the $k^{th}$ carry signal CR[k] of the second level voltage.

The fifth transistor T5, the gate of which is connected to the first control node Q, may be turned on, and the second control node QB may be set to the second level voltage of the third voltage VGL2. Accordingly, the $14^{th}$-1 to $14^{th}$-4 transistors T14a, T14b, T14c, and T14d, the sixteenth transistor T16, and the eighteenth transistor T18 may be turned off.

During a third period P3, the previous carry signal CR[k−1] of the second level voltage is supplied and the next carry signal CR[k+1] of the second level voltage is supplied. The first boosting clock signal BCK1 and the first carry clock signal CR_CK1 of the first level voltage is supplied, and the first to fourth scan clock signals SC_CK1 to SC_CK4 of the first level voltage are sequentially supplied.

The first transistor T1 may be turned off by the previous carry signal CR[k−1] of the second level voltage, and the first control node Q may be maintained at the first level voltage. Through the fifteenth transistor T15 that is turned on, the first boosting clock signal BCK1 of the first level voltage may be transmitted to the second node BN, and the voltage of the first control node Q may be boosted by the second capacitor C2 to be higher than the voltage of the first control node Q during the second period P2. Through the $13^{th}$-1 to $13^{th}$-4 transistors T13a, T13b, T13c, and T13d that are turned on, the first to fourth scan clock signals SC_CK1, SC_CK2, SC_CK3, and SC_CK4 of the first level voltage may be sequentially output from each of the $1^{st}$-1 to $1^{st}$-4 output terminals OUT11 to OUT14 as the $p^{th}$ to $p+3^{th}$ gate signals GS[p] to GS[p+3] of the first level voltage. Also, through the seventeenth transistor T17 that is turned on, the first carry clock signal CR_CK1 of the first level voltage may be output from the second output terminal OUT2 as the $k^{th}$ carry signal CR[k] of the first level voltage.

The second transistor T2 having the gate connected to the first control node Q may be turned on and the first voltage VGH may be transmitted to the first node H, and thus, the leakage current due to the first transistor T1, the third transistor T3, the fourth transistor T4, the ninth transistor T9, and the twelfth transistor T12 that are turned off may be prevented. Therefore, the voltage level of the first control node Q may be stably maintained.

The second control node QB may maintain the second level voltage of the third voltage VGL2 by the fifth transistor T5 that is turned on.

During a fourth period P4, the previous carry signal CR[k−1] of the second level voltage is supplied and the next carry signal CR[k+1] of the first level voltage is supplied. The first boosting clock signal BCK1 and the first carry clock signal CR_CK1 of the second level voltage is supplied, and the first to fourth scan clock signals SC_CK1 to SC_CK4 of the second level voltage is supplied.

The seventh transistor T7 may be turned on by the next carry signal CR[k+1] of the first level voltage, and through the turned on seventh transistor T7, the voltage of the second control node QB may be set to the first level voltage of the first voltage VGH. Accordingly, the $14^{th}$-1 to $14^{th}$-4 transistors T14a, T14b, T14c, and T14d, the sixteenth transistor T16, and the eighteenth transistor T18 may be turned on. Through the turned on $14^{th}$-1 to $14^{th}$-4 transistors T14a, T14b, T14c, and T14d, the third voltage VGL2 may be output from each of the $1^{st}$-1 to $1^{st}$-4 output terminals OUT11 to OUT14 as the $p^{th}$ to $p+3^{th}$ gate signals GS[p] to GS[p+3] of the second level voltage. Through the turned on eighteenth transistor T18, the third voltage VGL2 may be output from the second output terminal OUT2 as the $k^{th}$ carry signal CR[k] of the second level voltage.

The sixth transistor T6 having the gate connected to the second control node QB may be turned on, and the first voltage VGH may be transmitted to the intermediate node of the $5^{th}$-1 transistor T5-1 and the $5^{th}$-2 transistor T5-2. Accordingly, the leakage current due to the $5^{th}$-1 transistor T5-1 and the $5^{th}$-2 transistor T5-2 that are turned off may be prevented, and the voltage level of the second control node QB may be stably maintained.

The third transistor T3 having the gate connected to the second control node QB may be turned on, and the voltage of the first control node Q may be set to the third voltage VGL2.

The fourth transistor T4 having the gate connected to the second input terminal IN2 may be turned on, and the previous carry signal CR[k−1] of the second level voltage may be transmitted to the first control node Q. That is, the $4^{th}$-1 transistor T4-1 and the $4^{th}$-2 transistor T4-2 may pull-down the boosted first control node Q and first node H to the second level voltage.

The $k^{th}$ carry signal CR[k] and the first control signal S1 may be supplied to the second control circuit 132 during the display period DP. When the first control signal S1 is supplied, the tenth transistor T10 is turned on, the $k^{th}$ carry signal CR[k] of the first level voltage is supplied to the sensing node M, and the first capacitor C1 may be charged. The eleventh transistor T11 having the gate connected to the sensing node M may be turned on.

FIG. 9 illustrates an operation of the $k^{th}$ stage STk during the vertical blank period VBP according to an embodiment. An example in which pixels corresponding to the $k^{th}$ stage STk are sensed during the sensing period SP of the vertical blank period VBP is described.

During the sensing period SP, the first boosting clock signal BCK1 of the first level voltage is supplied, the first carry clock signal CR_CK of the second level voltage is supplied, and the first to fourth scan clock signals SC_CK1 to SC_CK4 of the first level voltage are sequentially supplied. In an embodiment, the first to fourth scan clock signals SC_CK1 sequentially have the first level voltage during a part of the sensing period SP in which the boosting clock signal BCK1 has the first voltage level.

The second control signal S2 may be supplied to the second control circuit 132, and the first control node Q may be set to the first voltage VGH through the eleventh transistor T11 that is turned on with the gate thereof being connected to the sensing node M of the first level voltage and the twelfth transistor T12 that is turned on by the second control signal S2. The first boosting clock signal BCK1 of the first level voltage may be transmitted to the second node BN through the fifteenth transistor T15 that is turned on, and the voltage of the first control node Q may be boosted by the second capacitor C2 to be higher than the first voltage VGH.

The $13^{th}$-1 to $13^{th}$-4 transistors T13a, T13b, T13c, and T13d having the gates connected to the first control node Q may be turned on, and the first to fourth scan clock signals SC_CK1, SC_CK2, SC_CK3, and SC_CK4 of the first level voltage may be output from each of the $1^{st}$-1 to $1^{st}$-4 output terminals OUT11 to OUT14 as the $p^{th}$ to p+$3^{th}$ gate signals GS[p] to GS[p+3] of the first level voltage. Also, through the seventeenth transistor T17 that is turned on, the first carry clock signal CR_CK1 of the second level voltage may be output from the second output terminal OUT2 as the $k^{th}$ carry signal CR[k] of the second level voltage.

The second transistor M2 and the third transistor M3 of each of the pixels PX of the $p^{th}$ to p+$3^{th}$ rows receiving the $p^{th}$ to p+$3^{th}$ gate signals GS[p] to GS[p+3] may be turned on to enable sensing of sense state information of the first transistor M1 and the organic light-emitting diode OLED.

Figure 12:
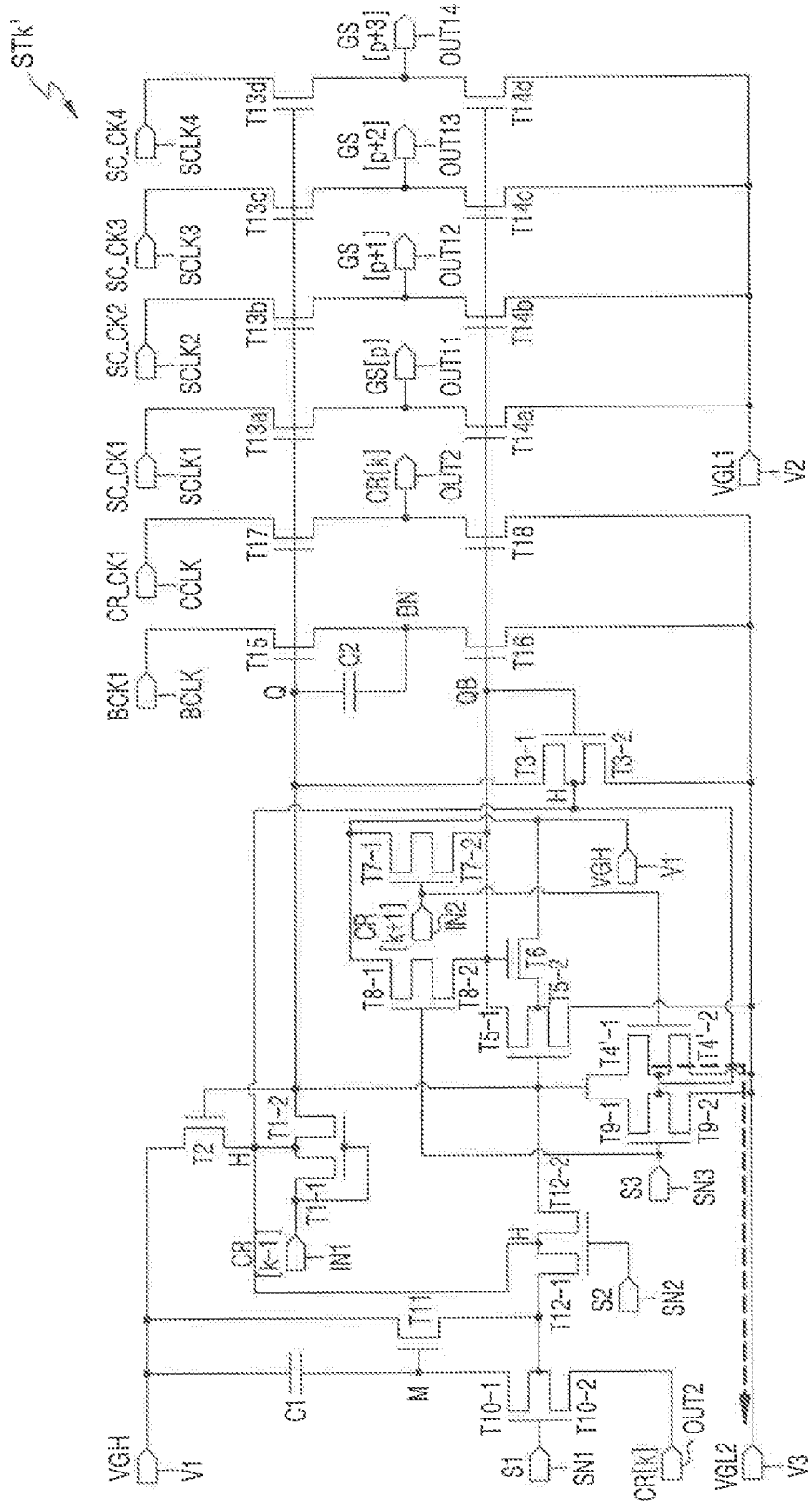
FIG. 12 is a circuit diagram of an example of a stage included in a gate driving circuit according to an embodiment.

FIG. 12 is a circuit diagram of an example of a stage included in a gate driving circuit according to an embodiment. For example, the stage in FIG. 12 may be used to implement the stages shown in FIG. 4 (e.g., ST1, ST2, etc.).

A stage STk' illustrated in FIG. 12 may include a fourth transistor T4' having a different location from the fourth transistor T4 of the stage STk illustrated in FIG. 7. Other structures and operations of the stage STk' illustrated in FIG. 12 may be substantially the same or similar as the structures and operations of the stage STk illustrated in FIG. 7.

Referring to FIG. 12, the fourth transistor T4' is connected between the first control node Q and the third voltage input terminal V3. In an embodiment, the fourth transistor T4' includes a pair of $4^{th}$-1 transistor T4'-1 and $4^{th}$-2 transistor T4'-2. Gates of the $4^{th}$-1 transistor T4'-1 and the $4^{th}$-2 transistor T4'-2 may be connected to the second input terminal IN2. An intermediate node (a common electrode) between the $4^{th}$-1 transistor T4'-1 and the $4^{th}$-2 transistor T4'-2 may be connected to the first node H and may be set to the first voltage VGH transmitted through the second transistor T2. The $4^{th}$-1 transistor T4'-1 and the $4^{th}$-2 transistor T4'-2 may be turned on when the next carry signal CR[k+1] is supplied and may set the voltage of the first control node Q to the third voltage VGL2.

Figure 13:
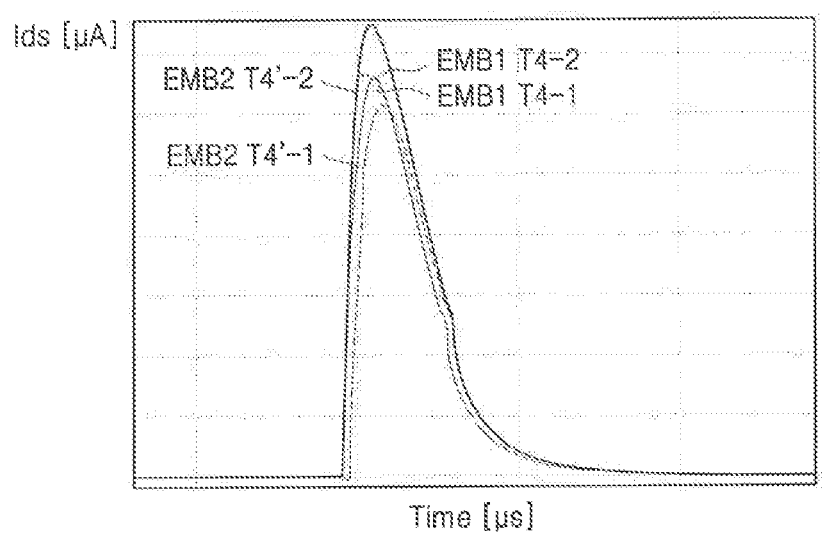
FIGS. 13 and 14 are diagrams for describing a current according to operations of a fourth transistor of the stage illustrated in FIG. 7 and the stage illustrated in FIG. 12.
Figure 14:
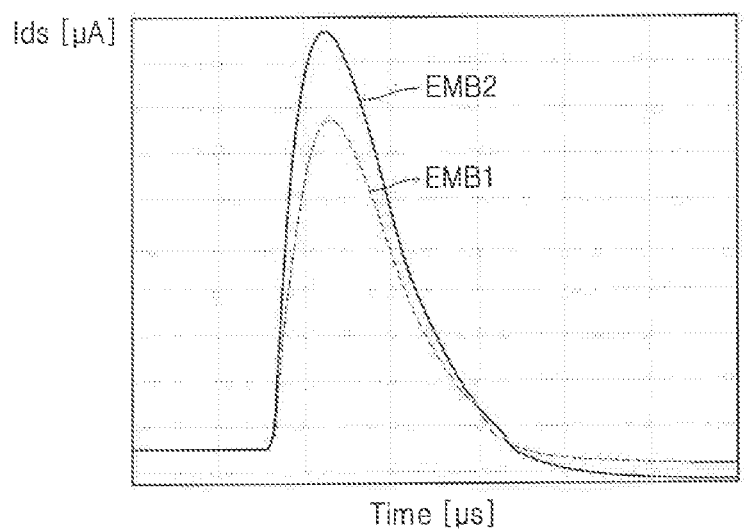

FIGS. 13 and 14 are diagrams for describing a current according to the fourth transistors of the stage illustrated in FIG. 7 and the stage illustrated in FIG. 12. FIGS. 13 and 14 show the examples in which the transistors of the stage illustrated in FIG. 7 and the stage illustrated in FIG. 12 correspond to oxide thin-film transistors including amorphous ITGZO semiconductors.

In a high-mobility oxide thin-film transistor, a threshold voltage may be negative shifted at a high temperature, and when the threshold voltage is negative shifted and a gate-source voltage (Vgs) and a drain-source voltage (Vds) are simultaneously applied, the high-mobility oxide thin-film transistor may be destroyed by stress and deterioration. In particular, compared with an oxide thin-film transistor including an amorphous IGZO semiconductor, in the case of the oxide thin-film transistor including the amorphous ITGZO semiconductor, an area to which the gate-source voltage (Vgs) and the drain-source voltage (Vds) can be simultaneously applied for a stable operation without a breakdown in the negative shifted state may be reduced, and thus, an operation voltage range may be decreased.

The gate-source voltage (Vgs) of each of a pair of sub-transistors may be different from each other. For example, in the stage STk illustrated in FIG. 7, the gate-source voltage (Vgs) of the $4^{th}$-1 transistor T4-1 and the gate-source voltage (Vgs) of the $4^{th}$-2 transistor T4-2 may be different from each other. Thus, the $4^{th}$-2 transistor T4-2 may be turned on before the $4^{th}$-1 transistor T4-1. As illustrated in FIG. 11, a current path may be formed from the first node H of the $k^{th}$ stage STk to the third voltage input terminal V3 of the k−$1^{th}$ stage STk−1 through the $4^{th}$-2 transistor T4-2 of the $k^{th}$ stage STk and the eighteenth transistor T18 of the k−$1^{th}$ stage STk−1.

Similarly, in the stage STk' illustrated in FIG. 12, the gate-source voltage (Vgs) of the $4^{th}$-1 transistor T4'-1 and the gate-source voltage (Vgs) of the $4^{th}$-2 transistor T4'-2 may be different from each other. Thus, the $4^{th}$-2 transistor T4'-2 may be turned on before the $4^{th}$-1 transistor T4'-1. As illustrated in FIG. 12, in the $k^{th}$ stage STk', a current path may be formed from the first node H of the $k^{th}$ stage STk' to the third voltage input terminal V3 through the $4^{th}$-2 transistor T4'-2.

The current path through two transistors may have an increased resistance compared to a current path through a single transistor. Accordingly, a pull-down point of the voltage of the first node H in the stage STk illustrated in FIG. 7 may be delayed compared to a pull-down point of the voltage of the first node H in the stage STk' illustrated in FIG. 12. In the stage STk' illustrated in FIG. 12, the pull-down point of the voltage of the first node H is before a pull-down point of the voltage of the first control node Q. Thus, current leakage in the first node H may be increased and deterioration of the $4^{th}$-2 transistor T4'-2 may be intensified. However, in the stage STk illustrated in FIG. 7, the pull-down point of the voltage of the first node H may be approximately the same as the pull-down point of the voltage of the first control node Q.

As illustrated in FIG. 13, in an operation EMB1 of the stage STk illustrated in FIG. 7, current graphs of the $4^{th}$-1 transistor T4-1 and the $4^{th}$-2 transistor T4-2 approximately match each other. However, in an operation EMB2 of the stage STk' illustrated in FIG. 12, current graphs of the $4^{th}$-1 transistor T4'-1 and the $4^{th}$-2 transistor T4'-2 are different from each other.

Also, as illustrated in FIG. 14, based on the same channel area, a current value of the fourth transistor T4 in the operation EMB1 of the stage STk illustrated in FIG. 7 is lower than a current value of the fourth transistor T4' in the operation EMB2 of the stage STk' illustrated in FIG. 12. Thus, as shown in Table 1 below, an heat index of the fourth transistor T4 in the operation EMB1 of the stage STk illustrated in FIG. 7 is lower than an heat index of the fourth transistor T4' in the operation EMB2 of the stage STk' illustrated in FIG. 12.

TABLE 1

|  | Vds * Ids (300 u~302.6 u) [uW] | T4 channel area (200 × 7) [u m$^2$] | Heat index [W/m$^2$] |
| --- | --- | --- | --- |
| EMB2 | 6.55E−04 | 1400 | 0.468 |
| EMB1 | 5.48E−04 | 1400 | 0.391 |

According to an embodiment, in the case of a gate driving circuit including an amorphous ITGZO semiconductor, a pair of fourth sub-transistors T4-1 and T4-2 configured to pull-down the first control node Q is connected to a carry output terminal of a previous stage, and thus, heat of the $4^{th}$-2 transistor T4-2 may be reduced. Thus, deterioration may be decreased, and a high temperature reliability margin of the gate driving circuit may be obtained.

In a gate driving circuit according to an embodiment, in each stage, a transistor (for example, the fourth transistor of FIG. 7) configured to pull-down the voltage of the first control node boosted to a first voltage level, to a second voltage level may include a plurality of sub-transistors that are connected in series, and may be connected to the first control node and the carry signal output terminal of the previous stage. Accordingly, a current path may be formed from the first control node of a current stage to a low voltage source (for example, the third voltage VGL2 of FIG. 7) through the fourth transistor and a pull-down transistor (for example, the eighteenth transistor of FIG. 7) connected to the carry signal output terminal of the previous stage. Based on the difference between gate-source voltages (Vgs) of the sub-transistors included in the fourth transistor, a phenomenon in which the degree of deterioration of the sub-transistors varies according to a difference between pull-down points of the voltage of the intermediate node between the sub-transistors and the voltage of the first control node, may be minimized. According to an embodiment, a length and a resistance of the current path through the fourth transistor configured to pull-down the voltage of the first control node may be increased. Thus, defects of the gate driving circuit due to a difference in the degree of deterioration between the sub-transistors included in the fourth transistor may be minimized.

One or more embodiments presented above include a gate driving circuit configured to stably output a gate signal and a display apparatus including the gate driving circuit. However, the effects of the disclosure are not limited to those described above and may be variously expanded within the scope of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A gate driving circuit comprising a plurality of stages each comprising:
    a first control circuit connected to a first voltage input terminal receiving a first voltage and a second voltage input terminal receiving a second voltage lower than the first voltage, the first control circuit being configured to control voltage levels of a first control node and a second control node;
    a first output circuit connected to a first clock terminal and a third voltage input terminal receiving a third voltage, the first output circuit being configured to output a gate signal according to the voltage levels of the first control node and the second control node; and
    a second output circuit connected to a second clock terminal and the second voltage input terminal, the second output circuit being configured to output a carry signal according to the voltage levels of the first control node and the second control node,
    wherein the first control circuit comprises:
        a first transistor connected to a first input terminal and the first control node, a gate of the first transistor being connected to the first input terminal; and
        a second transistor connected to the first input terminal and the first control node, a gate of the second transistor being connected to a second input terminal,
        wherein the second transistor comprises a first sub-transistor and a second sub-transistor that are connected in series, the first input terminal is connected to an output terminal of the second output circuit of a previous stage, and the second input terminal is connected to the output terminal of the second output circuit of a next stage,
        wherein the second voltage is lower than the third voltage.

2. The gate driving circuit of claim 1, wherein the first transistor comprises a first sub-transistor and a second sub-transistor that are connected in series, and the first control circuit further comprises:
  a third transistor connected to the first control node and the second voltage input terminal, a gate of the third transistor being connected to the second control node; and
  a fourth transistor connected between the first voltage input terminal and an intermediate node between the first sub-transistor and the second sub-transistor of the first transistor, a gate of the fourth transistor being connected to the first control node.

3. The gate driving circuit of claim 2, wherein the first control circuit further comprises:
  a fifth transistor connected to the second control node and the second voltage input terminal, a gate of the fifth transistor being connected to the first control node; and
  a sixth transistor connected to the first voltage input terminal and the second control node, a gate of the sixth transistor being connected to the second input terminal.

4. The gate driving circuit of claim 3, wherein the fifth transistor comprises a first sub-transistor and a second sub-transistor that are connected in series, and the first control circuit further comprises a seventh transistor connected between the first voltage input terminal and an intermediate node between the first sub-transistor and the second sub-transistor of the fifth transistor, a gate of the seventh transistor being connected to the second control node.

5. The gate driving circuit of claim 1, wherein each of the plurality of stages further comprises:
  a third transistor connected to the first control node and the second voltage input terminal, a gate of the third transistor being connected to a terminal receiving a first control signal; and
  a fourth transistor connected to the first voltage input terminal and the second control node, a gate of the fourth transistor being connected to the terminal receiving the first control signal.

6. The gate driving circuit of claim 1, wherein the first output circuit comprises a plurality of sub-output circuits configured to output a plurality of gate signals, the first clock terminal of each of the plurality of sub-output circuits receive a corresponding one of a plurality of first clock signals, and the plurality of first clock signals have a same waveform and have phases shifted by a predetermined interval.

7. The gate driving circuit of claim 6, wherein each of the plurality of stages further comprises a boosting circuit connected to a third clock terminal and the second voltage input terminal, the boosting circuit being configured to boost the voltage level of the first control node, wherein a period during which a third clock signal that is input to the third clock terminal is a gate-on voltage overlaps periods during which the plurality of first clock signals are the gate-on voltage.

8. The gate driving circuit of claim 7, wherein the boosting circuit comprises:
  a third transistor connected to the third clock terminal and a first node, a gate of the third transistor being connected to the first control node;
  a fourth transistor connected to the first node and the second voltage input terminal, a gate of the fourth transistor being connected to the second control node; and
  a first capacitor connected to the first control node and the first node.

9. The gate driving circuit of claim 1, wherein the second output circuit comprises:
  a third transistor connected to the second clock terminal and the output terminal configured to output the carry signal, a gate of the third transistor being connected to the first control node; and
  a fourth transistor connected to the output terminal and the second voltage input terminal, a gate of the fourth transistor being connected to the second control node.

10. The gate driving circuit of claim 1, wherein each of the plurality of stages further comprises a second control circuit connected to the first voltage input terminal and the first control node, the second control circuit being configured to control the voltage level of the first control node during a sensing period of a frame comprising a display period and the sensing period.

11. The gate driving circuit of claim 10, wherein the second control circuit comprises:
  a first capacitor connected to the first voltage input terminal and a sensing node;
  a third transistor connected to the sensing node and the output terminal configured to output the carry signal, the third transistor comprising a first sub-transistor and a second sub-transistor that are connected in series;
  a fourth transistor connected to the first voltage input terminal and an intermediate node between the first sub-transistor and the second sub-transistor of the third transistor, a gate of the fourth transistor being connected to the sensing node; and
  a fifth transistor connected to the fourth transistor and the first control node.

12. The gate driving circuit of claim 11, wherein the third transistor is configured to be turned on by a second control signal synchronized to the carry signal output during the display period and to set a voltage of the sensing node as a voltage of the carry signal.

13. The gate driving circuit of claim 11, wherein the sixteenth transistor is configured to be turned on by a third control signal that is input during the sensing period and to set a voltage of the first control node to the first voltage transmitted through the fourth transistor that is turned on.

14. A gate driving circuit comprising a plurality of stages, each comprising:
  a first output circuit comprising a first pull-up transistor and a first pull-down transistor, a gate of the first pull-up transistor being connected to a first control node, a gate of the first pull-down transistor being connected to a second control node, and the first output circuit being configured to output a gate signal;
  a second output circuit comprising a second pull-up transistor and a second pull-down transistor, a gate of the second pull-up transistor being connected to the first control node, a gate of the second pull-down transistor being connected to the second control node, and the second output circuit being configured to output a carry signal;
  a boosting circuit configured to boost a voltage level of the first control node; and
  a control circuit configured to control the voltage level of the first control node and a voltage level of the second control node,
  wherein the control circuit comprises:
    a first transistor comprising a first sub-transistor and a second sub-transistor that are connected in series, and
  wherein the first transistor is configured to pull-down, to a second voltage level through a second pull-down transistor of a previous stage, a voltage of the first control node boosted by the boosting circuit to a first voltage level.

15. The gate driving circuit of claim 14, wherein the control circuit further comprises:
   a second transistor connected to a first input terminal to which a carry signal of a previous stage is input and the first control node, a gate of the second transistor being connected to the first input terminal;
   a third transistor connected to a first voltage input terminal to which the first voltage is input and the second control node, a gate of the third transistor being connected to a second input terminal to which a carry signal of a next stage is input;
   a fourth transistor connected to the second control node and a second voltage input terminal to which the second voltage that is lower than the first voltage is input, a gate of the fourth transistor being connected to the first control node; and
   a fifth transistor connected to the first control node and the second voltage input terminal, a gate of the fifth transistor being connected to the second control node,
   wherein the first transistor is connected to the first input terminal and the first control node and a gate of the first transistor is connected to the second input terminal.

16. The gate driving circuit of claim 15, wherein the second transistor and the fourth transistor each comprise a first sub-transistor and a second sub-transistor that are connected in series, and the first control circuit further comprises:
   a sixth transistor connected between the first voltage input terminal and an intermediate node between the first sub-transistor and the second sub-transistor of the second transistor, a gate of the sixth transistor being connected to the first control node; and a seventh transistor connected between the first voltage input terminal and an intermediate node between the first sub-transistor and the second sub-transistor of the fourth transistor, a gate of the seventh transistor being connected to the second control node.

17. The gate driving circuit of claim 15, wherein each of the plurality of stages further comprises a second control circuit configured to control the voltage level of the first control node during a sensing period of one frame.

18. The gate driving circuit of claim 17, wherein the second control circuit comprises:
   a capacitor connected to the first voltage input terminal and a sensing node;
   a sixth transistor connected to the sensing node and an output terminal of the second output circuit, the sixth transistor comprising a first sub-transistor and a second sub-transistor that are connected in series;
   a seventh transistor connected to the first voltage input terminal and an intermediate node between the first sub-transistor and the second sub-transistor of the sixth transistor, a gate of the seventh transistor being connected to the sensing node; and
   an eighth transistor connected to the seventh transistor and the first control node.

19. An electronic device comprising:
   a display apparatus comprising:
   a gate driving circuit comprising a plurality of stages, each comprising:
   a first output circuit comprising a first pull-up transistor and a first pull-down transistor, a gate of the first pull-up transistor being connected to a first control node, a gate of the first pull-down transistor being connected to a second control node, and the first output circuit being configured to output a gate signal;
   a second output circuit comprising a second pull-up transistor and a second pull-down transistor, a gate of the second pull-up transistor being connected to the first control node, a gate of the second pull-down transistor being connected to the second control node, and the second output circuit being configured to output a carry signal;
   a boosting circuit configured to boost a voltage level of the first control node; and
   a control circuit configured to control the voltage level of the first control node and a voltage level of the second control node,
   wherein the control circuit comprises a first transistor comprising a first sub-transistor and a second sub-transistor that are connected in series,
   wherein the first output circuit comprises a plurality of sub-output circuits configured to output a plurality of gate signals, the first pull-up transistor of each of the plurality of sub-output circuits is connected to a scan clock terminal to which one of a plurality of scan clock signals is input and an output terminal configured to output the gate signals, and the plurality of scan clock signals have a same waveform and have phases shifted by a predetermined interval.

20. The electronic device of claim 19, wherein the boosting circuit comprises a capacitor configured to boost the voltage of the first control node in response to a boosting clock signal, and a period during which the boosting clock signal is a gate-on voltage overlaps periods during which the plurality of scan clock signals are the gate-on voltage.

* * * * *